(12) United States Patent
Karabacak et al.

(10) Patent No.: US 10,333,148 B2
(45) Date of Patent: Jun. 25, 2019

(54) DENSITY MODULATED THIN FILM ELECTRODES, METHODS OF MAKING SAME, AND APPLICATIONS OF SAME

(71) Applicant: BOARD OF TRUSTEES OF THE UNIVERSITY OF ARKANSAS, Little Rock, AR (US)

(72) Inventors: Tansel Karabacak, Little Rock, AR (US); Muhammed Taha Demirkan, Ankara (TR)

(73) Assignee: BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 0 days.

(21) Appl. No.: 15/010,628

(22) Filed: Jan. 29, 2016

(65) Prior Publication Data

US 2016/0226065 A1 Aug. 4, 2016

Related U.S. Application Data

(60) Provisional application No. 62/109,327, filed on Jan. 29, 2015.

(51) Int. Cl.
*H01M 4/66* (2006.01)
*H01M 4/485* (2010.01)
(Continued)

(52) U.S. Cl.
CPC ......... *H01M 4/661* (2013.01); *H01J 37/3405* (2013.01); *H01J 37/3417* (2013.01);
(Continued)

(58) Field of Classification Search
None
See application file for complete search history.

(56) References Cited

U.S. PATENT DOCUMENTS 5,616,437 A * 4/1997 Gao ..................... H01M 4/13
29/623.5
6,955,986 B2 10/2005 Li
(Continued)

OTHER PUBLICATIONS

Cheng, Fangyi et al., "Functional Materials for Rechargeable Batteries", Advanced Materials, vol. 23: No. 15, pp. 1695-1715, 2011.
(Continued)

*Primary Examiner* — Carmen V Lyles-Irving
(74) *Attorney, Agent, or Firm* — Locke Lord LLP; Tim Tingkang Xia, Esq.

(57) ABSTRACT

Density modulated thin film electrodes, methods of making the same, and applications of the same. The density modulated thin film electrode includes a substrate formed of a current collecting material, and a thin film formed of an electrode material on the substrate. The thin film has a first surface and an opposite, second surface, and a density that is changed with a distance defined from the first surface to a plane in the thin film, the plane being parallel to the first surface. The method includes depositing the electrode material on the substrate to form the thin film, where, during deposition of the electrode material, a pressure of an operating gas is controlled and changed to a predetermined pressure value according to a deposited thickness of the electrode material, so as to make the density of the thin film changed with the distance.

7 Claims, 19 Drawing Sheets

(51) Int. Cl.
| | |
|---|---|
| H01M 10/0525 | (2010.01) |
| H01J 37/34 | (2006.01) |
| H01M 4/04 | (2006.01) |
| H01M 4/36 | (2006.01) |
| H01M 4/38 | (2006.01) |
| H01M 4/58 | (2010.01) |
| H01M 4/02 | (2006.01) |

(52) U.S. Cl.
CPC ....... H01J 37/3426 (2013.01); H01M 4/0421 (2013.01); H01M 4/366 (2013.01); H01M 4/38 (2013.01); H01M 4/485 (2013.01); H01M 4/58 (2013.01); H01M 10/0525 (2013.01); *H01M 2004/021* (2013.01); *Y02T 10/7011* (2013.01)

(56) References Cited

U.S. PATENT DOCUMENTS

| | | | | |
|---|---|---|---|---|
| 2006/0251965 | A1* | 11/2006 | Nagayama | H01M 2/021 429/209 |
| 2007/0059502 | A1 | 3/2007 | Wang et al. | |
| 2008/0020281 | A1* | 1/2008 | Kogetsu | C23C 14/226 429/231.5 |
| 2009/0311567 | A1* | 12/2009 | Visco | H01M 2/1673 429/403 |
| 2010/0279003 | A1* | 11/2010 | Au | H01M 4/131 427/123 |
| 2010/0330435 | A1* | 12/2010 | Nemeth | H01M 8/184 429/402 |

OTHER PUBLICATIONS

Pillot, Christophe, "The worldwide battery market 2012-2025", Nice, France, Oct. 14-16, 2013.

Department of Energy Status Report, "One Million Electric Vehicles by 2015", D.O.E., Feb. 2011.

Gaines, Linda et al., "Lithium-Ion Batteries: Examining Material Demand and Recycling Issues", Argonne National Laboratory, Argonne, IL, 2011.

Tarascon, J.M. et al., "Issues and challenges facing rechargeable lithium batteries", Nature, vol. 414, pp. 359-367, Nov. 15, 2001.

United Nations: New York and Geneva, "Recommendations on the Transport of Dangerous Goods", Model Regulations, vol. II, Nineteenth Revised Edition, 2015.

Barnett, Brian et al., "PHEV Battery Cost Assessment", 2009 DOE Merit Review, Tiax LLC, May 19, 2009.

Dunn, Jennifer et al., "Impact of Recycling on Cradle-to-Gate Energy Consumption and Greenhouse Gas Emissions of Automotive Lithium-Ion Batteries", Environmental Science & Technology, vol. 46, pp. 12704-12710, Published: Oct. 17, 2012.

Goodenough, John et al., "Challenges for Rechargeable Li Batteries", Chemistry of Materials Review, vol. 22: No. 3, pp. 587-603, Published on Web: Aug. 28, 2009.

Aurbach, Doron et al., "Review on electrode-electrolyte solution interactions, related to cathode materials for Li-ion batteries", Journal of Power Sources, vol. 165: No. 2, pp. 491-499, Available online: Nov. 27, 2006.

Patil, Arun et al., "Issue and challenges facing rechargeable thin film lithium batteries" Materials Research Bulletin, vol. 43: No. 8-9, pp. 1913-1942, Available online: Sep. 1, 2007.

Kasavajjula, Uday et al., "Nano- and bulk-silicon-based insertion anodes for lithium-ion secondary cells", Journal of Power Sources, vol. 163: No. 2, pp. 1003-1039, Available online: Nov. 9, 2006.

Boukamp, B.A. et al., "All-Solid Lithium Electrodes with Mixed-Conductor Matrix", Journal of The Electrochemical Society, vol. 128: No. 4, pp. 725-729, 1981.

Cabana, Jordi et al., "Beyond Intercalation-Based Li-Ion Batteries: The State of the Art and Challenges of Electrode Materials Reacting Through Conversion Reactions", Advanced Energy Materials, vol. 22: No. 35, pp. E170-E192, 2010.

Sharma, R.A. et al., "Thermodynamic Properties of Lithium-Silicon System", Journal of Electrochemical Society, vol. 123: No. 8, pp. C239-C239, 1976.

Xu, Yu Hong et al., "Geometric and electronic studies of $Li_{15}Si_4$ for silicon anode", Electrochimica Acta, vol. 54: No. 2, pp. 341-345, Available online: Aug. 8, 2008.

Obrovac, M.N. et al., "Structural Changes in Silicon Anodes during Lithium Insertion/Extraction", Electrochemical and Solid-State Letters, vol. 7: No. 5, pp. A93-A96, Available electronically: Mar. 3, 2004.

Hatchard, T.D. et al., "In Situ XRD and Electrochemical Study of the Reaction of Lithium with Amorphous Silicon", Journal of The Electrochemical Society, vol. 151: No. 6, pp. A838-A842, Available electronically: Apr. 30, 2004.

Green, Mino et al., "Structured Silicon Anodes for Lithium Battery Applications", Electrochemical and Solid-State Letters, vol. 6: No. 5, pp. A75-A79, Available electronically: Mar. 5, 2003.

Holzapfel, Michael et al., "Nano silicon for lithium-ion batteries", Electrochimica Acta, vol. 52: No. 3, pp. 973-978, Available online: Aug. 8, 2006.

Lee, Jong-Hyuk et al., "Spherical silicon/graphite/carbon composites as anode material for lithium-ion batteries", Journal of Power Sources, vol. 176: No. 1, pp. 353-358, Available online: Oct. 18, 2007.

Lee, Heon-Young et al., "Carbon-coated nano-Si dispersed oxides/graphite composites as anode material for lithium ion batteries", Electrochemistry Communications, vol. 6: No. 5, pp. 465-469, Published online: Apr. 9, 2004.

Shu, Jie et al., "Cage-like carbon nanotubes/Si composite as anode material for lithium ion batteries", Electrochemistry Communications, vol. 8: No. 1, pp. 51-54, Available online: Nov. 17, 2005.

Chan, Candace et al., "High-performance lithium battery anodes using silicon nanowires", Nature Nanotechnology, vol. 3: No. 1, pp. 31-35, Published online: Dec. 16, 2007.

Teki, Ranganath et al., "Nanostructured Silicon Anodes for Lithoum Ion Rechargeable Batteries", Small, vol. 5: No. 20, pp. 2236-2242, 2009.

Fan, Yu et al., "High performance carbon nanotube-Si core-shell wires with a rationally structured core for lithium ion battery anodes", Nanoscale, vol. 5: No. 4, pp. 1503-1506, Accepted: Jan. 5, 2013.

Cui, Li-Feng et al., "Crystalline-Amorphous Core-Shell Silicon Nanowires for High Capacity and High Current Battery Electrodes", Nano Letters, vol. 9: No. 1, pp. 491-495, Published on Web: Dec. 23, 2008.

Lu, Congxiang et al., "Core-shell CNT-Ni—Si nanowires as a high performance anode material for lithium ion batteries", Carbon, vol. 63, pp. 54-60, Available online: Jun. 20, 2013.

Yi, Ran et al., "Micro-sized Si—C Composite with Interconnected Nanoscale Building Blocks as High-Performance Anodes for Practical Application in Lithium-Ion Batteries", Advanced Energy Materials, vol. 3: No. 3, pp. 295-300, 2013.

Yu, Cunjiang et al., "Silicon Thin Films as Anodes for High-Perfomance Lithium-Ion Batteries with Effective Stress Relaxation", Advanced Energy Materials, vol. 2, pp. 68-73, 2012.

Wu, Hui et al., "Stable cycling of double-walled silicon nanotube battery anodes through solid-electrolyte interphase control", Nature Nanotechnology, vol. 7: No. 5, pp. 309-314, Published Online: Mar. 25, 2012.

Kim, Hyesun et al., "Superior Lithium Electroactive Mesoporous Si@Carbon Core-Shell Nanowires for Lithium Battery Anode Material", Nano Letters, vol. 8: No. 11, pp. 3688-3691, Published on Web: Oct. 25, 2008.

Arie, A.A. et al., "Structural and electrochemical properties of fullerene-coated silicon thin film as anode materials for lithium secondary batteries", Materials Chemistry and Physics, vol. 113: No. 1, pp. 249-254, Accepted: Jul. 17, 2008.

Doh, Chil-Hoon et al., "A new SiO/C anode composition for lithium-ion battery", Journal of Power Sources, vol. 179: No. 1, pp. 367-370, Available online: Dec. 31, 2007.

(56) References Cited

OTHER PUBLICATIONS

Yurong, Ren et al., "SiO/CNTs: A new anode composition for lithium-ion battery", Science in China Series B: Chemistry, vol. 52: No. 12, pp. 2047-2050, Dec. 2009.
Takamura, Tsutomu et al., "A key technology to improve the cyclic performancers of carbonaceous materials for lithium secondary battery anodes", Journal of Power Sources, vol. 68: No. 1, pp. 114-119, Accepted: Dec. 21, 1996.
Patzig, C. et al., "Glancing angle sputter deposited nanostructures on rotating substrates: Experiments and simulations", Journal of Applied Physics, vol. 104: No. 9, pp. 094318-1-094318-9, 2008.
Ohara, Shigeki et al., "A thin film silicon anode for Li-ion batteries having a very large specific capacity and long cycle life", Journal of Power Sources, vol. 136: No. 2, pp. 303-306, 2004.
Ohara, Shigeki et al., "Li insertion/extraction reaction at a Si film evaporated on a Ni foil", Journal of Power Sources, vol. 119-121, pp. 591-596, 2003.
Uehara, Makiko et al., "Thick vacuum deposited silicon films suitable for the anode of Li-ion battery", Journal of Power Sources, vol. 146: No. 1-2, pp. 441-444, Available online: Jul. 20, 2005.
Takamura, Tsutomu et al., "High capacity and long cycle life silicon anode for Li-ion battery", Journal of Power Sources, vol. 158,: No. 2, pp. 1401-1404, Available online: Dec. 13, 2005.
Yin, Jingtian et al., "Micrometer-Scale Amorphous Si Thin-Film Electrodes Fabricated by Electron-Beam Deposition for Li-Ion Batteries", Journal of The Electrochemical Society, vol. 153, No. 3, pp. A472-A477, Available electronically: Jan. 24, 2006.
Wang, Y.H. et al., "Investigation of crack patterns and cyclic performance of Ti—Si nanocomposite thin film anodes for lithium ion batteries", Journal of Power Sources, vol. 202: No. 0, pp. 236-245, Available online: Dec. 9, 2011.
Li, Haixia et al., "Preparation and electrochemical performance of copper foam-supported amorphous silicon thin films for rechargeable lithium-ion batteries", Journal of Alloys and Compounds, vol. 509: No. 6, pp. 2919-2923, Available online: Dec. 1, 2010.
Takamura, Tsutomu et al., "A vacuum deposited Si film having a Li extraction capacity over 2000 mAh/g with a long cycle life", Journal of Power Sources, vol. 129: No. 1, pp. 96-100, 2004.
Graetz, J. et al., "Highly Reversible Lithium Storage in Nanostructured Silicon", Electrochemical and Solid-State Letters, vol. 6: No. 9, pp. A194-A197, Available electronically: Jul. 3, 2003.
Bourderau, S. et al., "Amorphous silicon as a possible anode material for Li-ion batteries", Journal of Power Sources, vol. 81-82, pp. 233 236, 1999.
Maranchi, J. P. et al., "Interfacial Properties of the a-Si/Cu:Active-Inactive Thin-Film Anode System for Lithium-Ion Batteries", Journal of The Electrochemical Society, vol. 153: No. 6, pp. A1246-A1253, 2006.
Lee, Ki-Lyoung et al., "Electrochemical characteristics of a-Si thin film anode for Li-ion rechargeable batteries", Journal of Power Sources, vol. 129: No. 2, pp. 270-274, Accepted: Oct. 20, 2003.
Karabacak, Tansel et al., "Stress reduction in tungsten films using nanostructured compliant layers", Journal of Applied Physics, vol. 96: No. 10, pp. 5740-5746, Nov. 15, 2004.
Karabacak, Tansel et al., "Stress reduction in sputter deposited films using nanostructured compliant layers by high working-gas pressures", Journal of Vacuum Science and Technology A, vol. 23: No. 4, pp. 986-990, Published: Jun. 27, 2005.
Alagoz, Arif et al., "Residual Stress Reduction in Sputter Deposited Thin Films by Density Modulation", MRS Proceedings (Fall Meeting), Manuscript ID: 1224-FF05-22.R1, 2009.
Sethuraman, Vijay A. et al., "In situ measurements of stress evolution in silicon thin films during electrochemical lithiation and delithiation", Journal of Power Sources, vol. 195: No. 15, pp. 5062-5066, Available online: Feb. 12, 2010.
Li, Juchuan et al., "Crack Pattern Formation in Thin Film Lithium-Ion Battery Electrodes", Journal of The Electrochemical Society, vol. 158: No. 6, pp. A689-A694, Published: Apr. 12, 2011.
Griffith, A.A., "The Phenomena of Rupture and Flow in Solids", Philosophical Transactions of the Royal Society of London, Series A, vol. 221, pp. 163-198, Published: Oct. 21, 1920.
Besenhard, J.O. et al., "Filming mechanism of lithium-carbon anodes in organic and inorganic electrolytes", Journal of Power Sources, vol. 54: No. 2, pp. 228-231, 1995.
Xiao, X. et al., "Improved cycling stability of silicon thin film electrodes through patterning for high energy density lithium batteries", Journal of Power Sources, vol. 196: No. 3, pp. 1409-1416, Available online: Sep. 24, 2010.
Krishnan, Rahul et al., "Functionally Strain-Graded Nanoscoops for High Power Li-Ion Battery Anodes", Nano Letters, vol. 11: No. 2, pp. 377-384, Published: Dec. 30, 2010.
Karabacak, Tansel et al., "Scaling during shadowing growth of isolated nanocolumns", Physical Review B, vol. 68: No. 12, pp. 125408-1-125408-5, 2003.
Sloop, Steven E. et al., "The role of Li-ion battery electrolyte reactivity in performance decline and self-discharge", Journal of Power Sources, vol. 119-121: No. 0, pp. 330-337, 2003.
Thornton, John A., "High Rate Thick Film Growth", Annual Review of Materials Science, vol. 7: No. 1, pp. 239-260, 1977.
Thornton, John A., "Influence of apparatus geometry and deposition conditions on the structure and topography of thick sputtered coatings", Journal of Vacuum and Science Technology, vol. 11: No. 4, pp. 666-670.
Thornton, John A., "Influence of substrate temperature and deposition rate on structure of thick sputtered Cu coatings", Journal of Vacuum and Science Technology, vol. 12: No. 4, pp. 830-835.
Thornton, John A., "The microstructure of sputter-deposited coatings", Journal of Vacuum and Science Technology A—Vacuum Surfaces and Films, vol. 4: No. 6, pp. 3059-3065, Accepted: Jun. 6, 1986.
Petrov, I. et al., "Microstructural evolution during film growth", Journal of Vacuum and Science Technology A—Vacuum Surfaces and Films, vol. 21: No. 5, pp. S117-S128, Published: Sep. 2, 2003.
Smith, Donald L., "Thin-Film Deposition: Principles and Practice", McGraw-Hill, Inc., ISBN 0-07-058502-4, 1995.
Roth, J.R., "Industrial Plasma Engineering, vol. 2: Applications to nonthermal plasma processing", ISBN: 0-7503-0544-4, Institute of Physics, 2001.
Karabacak, Tansel et al., "Growth-front roughening in amorphous silicon films by sputtering", Physical Review B, vol. 64: No. 8, pp. 085323-1-085323-6, Published: Aug. 8, 2001.
Young, Niels O., "Optically Active Fluorite Films", Nature, vol. 183: No. 4654, pp. 104-105, Jan. 10, 1959.
Karabacak, Tansel et al., "Physical self-assembly and the nucleation of three-dimensional nanostructures by oblique angle deposition", Journal of Vacuum and Science Technology A—Vacuum Surfaces and Films, vol. 22: No. 4, pp. 1778-1784, Published: Jul. 22, 2004.
Demirkan, M.T. et al., "Density Modulated Multilayer Silicon Films for Lithium-Ion Batteries", MRS Proceedings (Spring Meeting), Manuscript ID: 1265389, Mar. 29, 2012.
Demirkan, M.T. et al., "Cycling performance of density modulated multilayer silicon thin film anodes in Li-ion batteries", Journal of Power Sources, vol. 273, pp. 52-61, Available online: Sep. 16, 2014.
Jing Shilong et al., "Directly grown Si nanowire arrays on Cu foam with a coral-like surface for lithium-ion batteries", Nanoscale, vol. 6, pp. 14441-14445, Accepted: Oct. 9, 2014.
Jung, Sung Chul et al., "Anisotropic Volume Expansion of Crystalline Silicon during Electrochemical Lithium Insertion: An Atomic Level Rationale", Nano Letters, vol. 12, pp. 5342-5347, Revised: Sep. 5, 2012.
Windischmann, H., "Intrinsic stress in sputtered thin films", Journal of Vacuum and Science Technology A—Vacuum Surfaces and Films, vol. 9: No. 4, pp. 2431-2436, Accepted: Feb. 27, 1991.
Haghiri-Gosnet, A.M. et al., "Stress and microstructure in tungsten sputtered thin films", Journal of Vacuum and Science Technology A—Vacuum Surfaces and Films, vol. 7: No. 4, pp. 2663-2669, Accepted: Jan. 14, 1989.
Messier, R. et al., "Revised structure zone model for thin film physical structure", Journal of Vacuum and Science Technology A—Vacuum Surfaces and Films, vol. 2: No. 2, pp. 500-503, Accepted: Oct. 18, 1983.

(56) References Cited

OTHER PUBLICATIONS

Shaffer, Joseph, "Finite Element Analysis of Silicon Thin Films on Soft Substrates as Anodes for Lithium Ion Batteries", Arizona State University, May 2011.
Pal, Siladitya et al., "Modeling of lithium segregation induced delamination of a-Si thin film anode in Li-ion batteries", Computational Materials Science, vol. 79, pp. 877-887, Available online: Aug. 19, 2013.
Lin, Mark W. et al., "Application of Commercial Finite Element Codes for the Analysis of Induced Strain-Actuated Structures", Journal of Intelligent Material Systems and Structures, vol. 5, pp. 869-875, 1994.
Roylance, David, "Finite Element Analysis", Department of Materials Science and Engineering, Massachusetts Institute of Technology, Cambridge, MA, pp. 1-16, Feb. 28, 2011.
Freund, L.B. et al., "Thin Film Materials:Stress, Defect Formation and Surface Evolution", Cambridge University Press, 2003.
Lu, Chih-Shun, "Investigation of film-thickness determination by oscillating quartz resonators with large mass load", Journal of Applied Physics, vol. 43: No. 11, pp. 4385-4390.
Cansizoglu, Mehmet et al., "Enhanced Hydrogen Storage Properties of Magnesium Nanotrees with Nanoleaves", MRS Proceedings (Fall Meeting), Manuscript ID: Draft, Symposium Paper No. 1216-W05-03, 2009.
Chen, L.B. et al., "An amorphous Si thin film anode with high capacity and long cycling life for lithium ion batteries", Journal of Applied Electrochemistry, vol. 39, pp. 1157-1162, Published online: Jan. 8, 2009.

\* cited by examiner

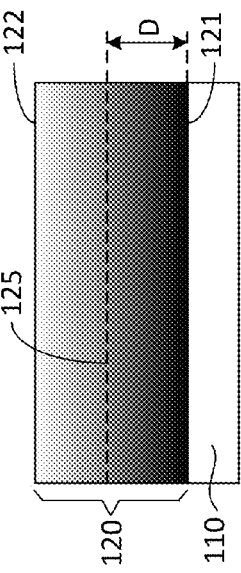
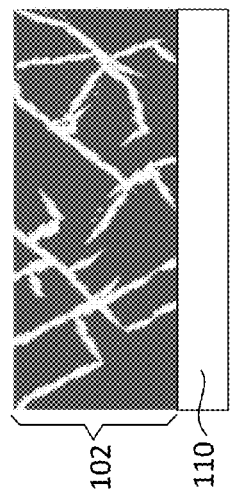
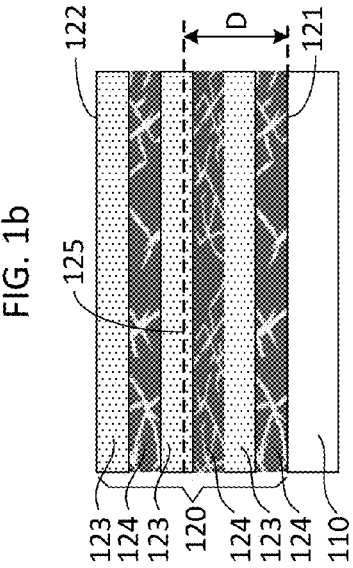
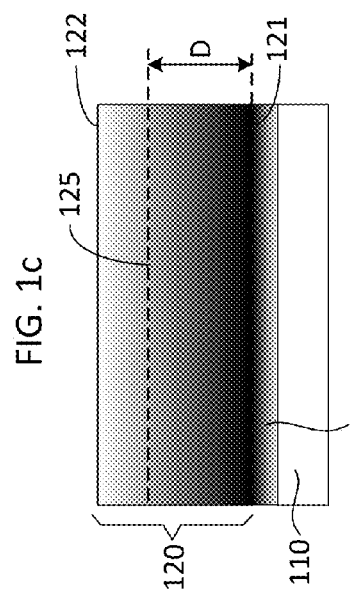
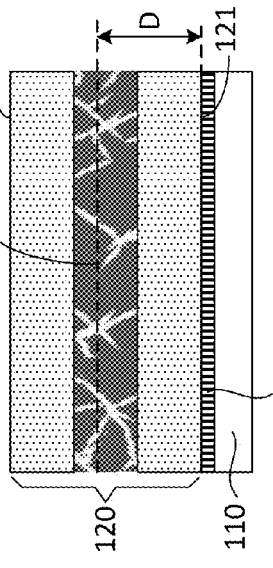

Table II. Thickness, density, porosity, and weight loading values of sputter deposited Si thin film samples produced at different Ar gas pressures. Standard deviation in the data listed is about 5%.

| Sample Number | Ar Gas Pressure ($\times 10^{-3}$ mbar) | Thickness (nm) | Density (g/cm$^3$) | Porosity (%) | Weight on Cu Foils (μg) |
|---|---|---|---|---|---|
| 1 | 2 | 90 | 2.27 | 2.6 | 26.6 |
| 2 | 8 | 97 | 1.99 | 14.6 | 25.3 |
| 3 | 14 | 122 | 1.77 | 24.0 | 26.3 |
| 4 | 20 | 124 | 1.67 | 28.3 | 26.3 |
| 5 | 26 | 128 | 1.64 | 29.6 | 23.3 |

FIG. 18

Table III. Computational models developed in order to characterize the stresses in density modulated thin film structures.

| Model Sets | Description | |
|---|---|---|
| 1. 2-layer-model with varying film thickness | Substrate thickness is 300 um while the thin film layer thickness varies. Five different thin film layer thickness, including 600, 800, 1000, 1200 and 1400 nm, are simulated in the calculations. | |
| 2. 3-layer-model with varying low-density thin film thickness | High-density film and substrate thicknesses are 1 um and 300 um respectively, while varying the low density film layer thickness. Varying low density thin film thicknesses including 60, 80, 100, 120, 140 nm. | |
| 3. 3-layer-model with varying high-density thin film thickness | Low-density film and substrate thicknesses are 100 nm and 300 um respectively, while varying the high density film layer thickness. Varying high density thin film thicknesses including 800, 900, 1000, 1100, 1200 nm. | |
| 4. 3-layer-model with varying Young's Modulus in the low-density thin film layer. | Low-density film layer, high-density film layer and substrate thicknesses are 100 nm, 1um and 300 um respectively, while varying the Young's Modulus in low density film layer. | |

FIG. 19

DENSITY MODULATED THIN FILM ELECTRODES, METHODS OF MAKING SAME, AND APPLICATIONS OF SAME

CROSS-REFERENCE TO RELATED PATENT APPLICATION

This application claims priority to and the benefit of, pursuant to 35 U.S.C. § 119(e), U.S. provisional patent application Ser. No. 62/109,327, filed Jan. 29, 2015, entitled "DENSITY MODULATED SILICON THIN FILMS, METHODS OF MAKING SAME, AND APPLICATIONS OF SAME," by Tansel Karabacak and Muhammed Taha Demirkan, which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [56] represents the 56th reference cited in the reference list, namely, Demirkan, M. T.; Trahey, L.; Karabacak, T., Cycling performance of density modulated multilayer silicon thin film anodes in Li-ion batteries. *J. of Power Sources* (2015), 273 (52).

FIELD OF THE INVENTION

The invention relates generally to batteries, and more particularly to density modulated thin film electrodes, methods of making the same, and applications of the same.

BACKGROUND OF THE INVENTION

The background description provided herein is for the purpose of generally presenting the context of the present invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the present invention.

Battery technologies have been gaining enormous importance over the past decade because of the increasing demand for high-power and high-energy density alternative energy systems especially in electric vehicle and portable electronics applications [1]. Various types of batteries have been developed. Among them, lithium-ion (Li-ion) batteries can offer superior electrochemical characteristics including high-energy density, high-voltage, and low self-discharge compared to other types of batteries such as nickel-cadmium and nickel-metal-hydride.[5] Because of these unprecedented properties, Li-ion batteries became the most popular battery type in portable electronics such as laptop computers, digital cameras, and cell phones.

Fabrication costs should be considered for the development of practical Li-ion batteries along with making quality electrode and electrolyte materials. A battery cost assessment made by Barnett et al. shows Li-ion batteries produced with the current technology may cost up to \$700/kWh[7] while DOE is targeting \$300/kWh for these batteries by 2015 [3]. Average total cost of the commercial electrolyte, cathode, and anode materials is about \$70/kg, while the rest of the cell components cost only \$5/kg [7]. For instance, during the production of $LiMn_2O_4$ as a cathode material, about 10 MJ/kg energy (approximately 15% of the production energy of a whole battery) is consumed which is the 2nd most costly material in the list [8]. Graphite, which is the current commercial anode material, also has a significant contribution to the fabrication costs (about 8 MJ/kg) [8]. Therefore, new anode materials that will take the graphite's place need to be low-cost and abundant in nature. In addition, each of the components of Li-ion batteries plays important roles in determination of the electrochemical properties. Main important requirements that electrolyte materials should have are high ionic conductivity for Li ions, low electronic conductivity, safety, chemical stability, retention of electrode interface, and limited formation of solid-electrolyte interface (SEI) [9]. Previous studies mostly focused on electrodes instead of electrolyte because the problems in current electrolyte materials such ascarbonates of propylene (PC), ethylene (EC), diethyl (DEC), and dimethyle (DMC) with fairly optimal characteristics seem to be less significant than the problems in electrode materials [10]. The improvement with anode materials also should be done in accordance with the progress on cathode materials in order to make feasible Li-ion batteries. Theoretical specific capacity value of current commercial cathode materials is only a few hundredsmAh/g [11].

Intensive investigation is going on the development of high-capacity cathode materials, yet "high capacity" is theoretically quite limited for intercalation cathodes. High capacity cathode alternatives are limited by the strict chemical criteria for Li-ion batteries [9]. Therefore, it has become more feasible to increase the capacity of anodes rather than that of cathodes [12]. For example, in the case where the specific capacity of a Li-ion cell cathode is 200 mAh/g, the capacity of the anode should be at least 1200 mAh/g in order to reach a theoretical total battery capacity of 86 mAh/g assuming the specific mass (the mass that does not contribute in the capacity) of the other cell components (case, separator, etc.) is $5.8 \times 10^{-3}$ g/mAh [12]. Therefore, the limiting factor for the total capacity of a Li-ion battery is considered to be the anode side in the current state-of-the-art cells.

Anode materials made with different modifications of carbonaceous materials have been commercialized and used in Li-ion batteries because of good mechanical stability of carbon. For instance, structural integrity of graphite made from commercial coke (i.e., a carbonaceous material typically obtained from coal) is high enough so that it can tolerate 10% structural change, which is quite small compared to other anode materials. Nonetheless, theoretical maximum capacity limit of graphite has already been reached, and several other materials were tested in order to find new suitable anode materials for Li-ion batteries such as Li-metal and Li-semiconductor composites. Among these materials, significant discoveries have been made in the past decade on the anode materials such as tin (Sn) and silicon (Si). Transition metal oxides also became favorable in recent studies because of their abilities to accommodate more than one Li ion in the unit metal structure, thus making high capacity anodes [14]. However, they have higher lithiation potentials than Si, which limit the cell voltage substantially, and none of them can reach the theoretical capacity value of silicon. The exceptionally impressive properties of Si make it very attractive among others, yet the development of Si anodes is lagged to produce practical batteries because of the problems that will be discussed in the following sections.

Si has become one of the most prominent candidates for lithium-ion battery anodes since it was found to be a reversible host material for lithium intercalation [15]. Structural properties of Li—Si alloys (e.g., $Li_{13}Si_4$, $Li_{22}Si_5$) have been studied and it was shown that although the structure of $Li_{22}Si_5$ was considered to be more favorable for Li-ion battery applications because of its high specific theoretical capacity (about 4200 mAh/g, Table-1), the theoretical value of this morphology or any close capacity values have not been experimentally observed. Instead, capacity of about 3580 mAh/g for $Li_{15}Si_4$ (cubic) structure was observed in recent studies, which is still much better than other candidates [16]. The structure of this phase is assumed to be the same with $Cu_{15}Si_4$ and $Li_{15}Ge_4$ and was able to hold 2.5 Li ions per one Si atom [17].

High Volume Change of Si Anode:

Change of the structural properties of Si during Li insertion/extraction generates a significant problem for Li-ion batteries as in some of the metal and metal-oxide anodes. A vast volume expansion of about 269% in lithiation/delithiation of $Li_{15}Si_4$ causes fracturing and pulverization of the Si anode. This mechanical instability leads to poor charging-discharging cycleability and short battery lifetime. In addition, electronic conductivity of Si, which is already low (about $10^{-5}$ S/m), is further reduced due to the cracks and crumbling formed during $Li^+$ incorporation/removal. Therefore, high volume expansion/contraction of Si during lithiation/delithiation reactions eventually becomes the main reason for degradation of its electrochemical properties.

Solid-Electrolyte Interface (SEI) Layer Formation on the Electrode Surface:

SEI layer is a coating incorporating residual materials and Li atoms that forms on the surface of electrodes due to the side reactions occurring during the operation of Li-ion batteries. SEI layer usually emerges in the first few cycles. This initial SEI formation is useful because it acts as a passivation layer and avoids the further side reactions and consumption of Li ions. Once SEI layer forms, it allows Li ions to pass through into the electrode while keeping the electronic resistance high. There is an "energy window" associated with the electrolyte that should be in accordance with the chemical potentials (Fermi energy) of the anode and the cathode [9]. Fermi energies of anode and cathode materials should match the HOMO (highest occupied molecular orbital) and LUMO (lowest unoccupied molecular orbital) of the electrolyte in Li-ion batteries, respectively; otherwise the electrolyte will get reduced (anode) or oxidized (cathode). For instance, potentials (vs. $Li^+/Li$) of graphite (0.05 V) and Si (0.2 V) are much lower than the HOMO energy of a common electrolyte of 1M $LiPF_6$ in EC/DEC (1:1), which is about 1 V. In this case, an SEI layer is necessary to prevent the electrons passing from electrolyte to cathode and from anode to electrolyte [9]. It means that graphite owes its popularity mainly to the formation of SEI layer or else it would be useless in Li-ion batteries. Therefore, Si also needs a stable SEI layer formation in order to be used as an anode material. If the SEI layer breaks and gets pulled off the surface, new SEI layer forms. In this case, more Li ions are consumed, and more undesired residual compounds emerge as dendrites. If this occurs repeatedly, since these dendrites are not wiped out, it finally ends up with shortcut failure. A SEI layer should be stable and be able to repair itself quickly right after any crack emerges. However, silicon's high volume change during charging/discharging, widespread crack formation throughout the whole film, and therefore extensive exposure of fresh Si to electrolyte can further amplify the rate of SEI layer formation and quickly cause cell failure. Therefore, SEI formation on Si anode materials and its relation to film's microstructure and mechanical properties needs to be better understood. SEI layer formation on Si thin film anodes will be further discussed in the following sections.

Earlier Studies to Address Problems Associated with Si Anodes:

Previous studies have attempted several approaches to solve the problems associated with Si/Li intercalation summarized above. Coatings on Si, using active and inactive additives, Si—C composites, nanostructures of elemental Si and its composites, and Si thin films have been investigated for this purpose [1, 12, 18]. These methods were successful only to a certain extent and generally addressed few of the several issues of Si anodes. Using additives and coatings was considered to be an effective way to minimize the stress caused by high volume change. It also provides electronic contact between Si particles that considerably affects the capacity, which then provides enhanced capacity retention. On the other hand, theoretical specific capacity values of Si-based anode materials with active or inactive chemical additives typically range from 300-1700 mAh/g [12, 19], which is much lower than the about 3580 mAh/g capacity of elemental Si. Experimental values for these Si-based composite materials were found to be even poorer. For example, among the highest reported values, Si powder with carbon nanotube additives showed a capacity of 940 mAh/g [20].

Si nanowires were also tested as anode materials [21], and they have provided specific capacity values as high as 2800 mAh/g at the end of 10th cycle [5]. Nano-sized materials can significantly improve the lithium transport properties due to the high surface to volume ratio and high electrode porosity, and therefore, increase in the electrochemical properties has been expected [1]. Nevertheless, the capacity measurements were limited to only a few tens of cycles, which is not compatible for current commercial batteries. Amount of SEI layer formation is also increased with the enlarged electrode surface area, leading to more consumption of $Li^+$, and thus decreasing the cycling performance. Recently, CNT-Si core-shell wire composites showed the specific capacity value of about 2900 mAh/g at the 80th cycle [22]. Cui et al. [23] reported a capacity of 1000 mAh/g and a capacity retention of 90% at the 100th cycle with nanowires that include crystalline Si cores and amorphous Si shells. Another study also reported CNT-Si—Ni nanowires achieving 2000 mAh/g specific capacity at the 100th cycle [24]. Several other Si—C composite approaches were also proposed to overcome the problems with Si anodes. Yi et al. [25] were able to produce Si—C composite materials showing specific capacity value of 1500 mAh/g at the 200th cycle. Focus of another study by Yu et al. [26] was to avoid the stress problems using Si ribbons patterned on soft substrates. A capacity retention of 84.6% was achieved at the 500th cycle with a capacity of 3498 mAh/g. Similarly, Wu et al. [27] proposed the development of Si nanotubes covered with a $SiO_x$ layer to improve the mechanical properties of Si anodes. Capacity values of 1200 mAh/g at the 600th cycle and 600 mAh/g at the 6000th cycle were achieved at 1C and 12C discharging rates, respectively, for these novel $SiO_x$/Si nanotubes. To the best our knowledge, these results seem to be the highest specific capacity values over such large number of cycles ever reported among nanostructured Si anodes.

However, fabrication methods listed above are often complicated and high-cost, which make them difficult to be implemented in practical battery applications. Although Si—C composites produced by relatively more well-developed fabrication techniques such as pyrolysis, milling, and chemical vapor reactions have given reasonably good capacity retention (for instance, Kim et al. [28] showed that Si—C composite nanowires can provide a discharge capacity of 2768 mAh/g with the capacity retention of 87% at the 80th cycle), requirement of heat treatment, longtime of production, and in some cases need for nanostructured templates make those methods also significantly complex and expensive [12, 19].

On the other hand, thin film growth techniques such as sputter deposition or chemical vapor deposition are much more practical and inexpensive compared to the approaches listed above [30]. Thin film anodes have several advantages over bulk materials in Li-ion batteries. They usually provide better stability and capacity retention. They operate kinetically faster due to shorter pathways for Li-ion insertion/deinsertion. Si thin films have proven to demonstrate prominent results with extensively high specific capacities [12, 31]. However, for practical use of Si thin films in batteries with overall high capacities, they should be thick enough, at least in micron scales. Growing thick Si thin films is a major challenge since it generally suffers from stress build up during deposition followed by delamination from the substrate. Pulverization and stress problems become even worse when the thickness increases. Additional stress during lithiation/delithiation further decrease the mechanical stability. Although it is also a difficult task, improved adhesion of Si to the substrate can partially improve the resistance to stress and delamination [32]. Researchers tend to reduce the cycle number when the film thickness is higher because of the mechanical instability problems discussed above. To the best of our knowledge, considering the film thickness, cycling number, and the capacity values, the best performance was reported by Uehara et al. [31c] with a 1 μm thick Si thin film anode, which lasted for 200 cycles with a final specific capacity value of 1700 mAh/g. However, we note that high-capacity results in those studies were achieved only after additional processing steps such as substrate roughening by chemical etching to enhance film adhesion.

Therefore, a heretofore unaddressed need exists in the art to address the aforementioned deficiencies and inadequacies.

SUMMARY OF THE INVENTION

One of the objectives of this invention is to provide density modulated thin film electrodes for batteries, such as Li-ion batteries, with superior specific capacity and cycling stability. According to the invention, the density modulated film electrodes includes one or more electrode material layers with varying densities, either in the form of alternating high/low densities or graded densities, and have the ability to tolerate high volume change, stress evolution, and cracking during lithiation/delithiation, which provide enhanced film stability, better adhesion to the current collector, and improved control over the solid-electrolyte interface (SEI) layer formation. In addition, the invention utilizes a simple yet novel approach of physical vapor deposition method such as sputter deposition or thermal evaporation for the fabrication of density modulated thin films and electrodes including the thin films with stress-compliant and pulverization-resistant properties. Furthermore, several methods of adhesion layers including graded composite film and glancing angle deposited (GLAD) nanorod arrays are employed to improve the adhesion strength of the density modulated thin films. The invention can lead to thin film electrodes with superior capacity and mechanical stability, and pave a way to the development of next generation Li-ion batteries.

In one aspect, the invention is related to a thin film of an electrode material. In one embodiment, the thin film of the electrode material includes at least one layer formed of the electrode material. The at least one layer has a first surface and an opposite, second surface, and a density that is changed with a distance defined from the first surface to a plane in the at least one layer, where the plane is parallel to the first surface. The distance has a maximal value corresponding to a thickness of the at least one layer defined between the first and second surfaces.

In one embodiment, the electrode material comprises silicon (Si), carbon (C), graphite, titanium (Ti), vanadium (V), chromium (Cr), manganese (Mn), cobalt (Co), iron (Fe), nickel (Ni), copper (Cu), germanium (Ge), silicon-carbon composite/compound, tin (Sn), tin-cobalt alloy, lithium titanate (LTO, $Li_4Ti_5O_{12}$), cobalt oxide ($CoO_2$), nickel oxide ($NiO_2$), manganese oxide ($MnO_2$), titanium sulfide ($TiS_2$, $TiS_3$), $Li_xFePO_4$, or the like.

In one embodiment, the density is gradually changed from a lowest density at one of the first and second surfaces to a highest density at the other of the first and second surfaces. In another embodiment, the density is changed in the form of one or multiple periods of a sine wave function of the distance. In yet another embodiment, the density is changed in the form of a rectangular function of the distance.

In one embodiment, the at least one layer of the electrode material comprises multiple layers of the electrode material formed such that layers having lower densities and layers having higher densities are alternately stacked to one another.

In another aspect, the invention relates to a method for fabricating the thin film of the electrode material as disclosed above. In one embodiment, the method includes during deposition of the electrode material, controlling and changing a pressure of an operating gas to a predetermined pressure value according to a deposited thickness of the electrode material, so as to form the at least one layer of the electrode material having the density changed with the distance.

In one embodiment, the operating gas comprises an inert gas or a reactive gas.

In one embodiment, the deposition of the electrode material is performed with a physical vapor deposition (PVD) comprising a sputter deposition, a thermal evaporation, an electron-beam evaporation, a cathodic arc deposition, a pulsed laser deposition (PLD), or the like.

In yet another aspect, the invention relates to an electrode usable for a battery. In one embodiment, the electrode has a substrate formed of a current collecting material, and at least one layer formed of an electrode material on the substrate. The at least one layer having a first surface and an opposite, second surface, and a density that is changed with a distance defined from the first surface to a plane in the at least one layer, where the plane is parallel to the first surface. The distance has a maximal value corresponding to a thickness of the at least one layer defined between the first and second surfaces.

In one embodiment, the electrode material comprises Si, C, graphite, Ti, V, Cr, Mn, Co, Fe, Ni, Cu, Ge, silicon-carbon composite/compound, Sn, tin-cobalt alloy, LTO, $Li_4Ti_5O_{12}$, $CoO_2$, $NiO_2$, $MnO_2$, $TiS_2$, $TiS_3$, $Li_xFePO_4$, or the like.

In one embodiment, the current collecting material comprises copper (Cu), nickel (Ni), aluminum (Al), or the like.

In one embodiment, the substrate comprises nanorod arrays formed of the current collecting material, such that the first surface of the at least one layer of the electrode material is substantially adhered to the substrate through the nanorod arrays.

In one embodiment, the electrode further includes an adhesion and compliant layer formed between the substrate and the at least one layer.

In one embodiment, the adhesion and compliant layer comprises nanorod arrays. In one embodiment, the adhesion and compliant layer is formed of chromium (Cr), titanium (Ti), nickel (Ni), tantalum (Ta), molybdenum (Mo), tungsten (W), or the like.

In another embodiment, the adhesion and compliant layer is a graded composite layer of the current collecting material and the electrode material, formed by co-depositing the current collecting material and the electrode material with varying compositions as a function of thickness of the graded composite layer, wherein the graded composite layer has a first surface being substantially adhered to the substrate and an opposite, second surface being substantially adhered to the first surface of the at least one layer of the electrode material, and wherein ratio of the current collecting material to the electrode material of the graded composite layer is gradually changed from 100:0 at the first surface of the graded composite layer to 0:100 at the second surface of the graded composite layer by controlling their relative deposition rates.

In one embodiment, the density of the at least one layer of the electrode material is gradually changed from a lowest density at one of the first and second surfaces to a highest density at the other of the first and second surfaces. In one embodiment, the electrode further includes a capping layer having a density higher than the lowest density, formed on the second surface of the at least one layer of the electrode material, when the density of the at least one layer of the electrode material at the second surface has the lowest density.

In another embodiment, the density is changed in the form of one or multiple periods of a sine wave function of the distance.

In yet another embodiment, the density is changed in the form of a rectangular function of the distance.

In one embodiment, the at least one layer of the electrode material comprises multiple layers of the electrode material formed such that layers having lower densities and layers having higher densities are alternately stacked to one another.

In one aspect of the invention, a method for fabricating an electrode includes providing the substrate formed of a current collecting material, and depositing the electrode material on the substrate to form the at least one layer, wherein, during deposition of the electrode material, a pressure of an operating gas is controlled and changed to a predetermined pressure value according to a deposited thickness of the electrode material, so that the at least one layer of the electrode material has the density changed with the distance.

In one embodiment, the electrode material comprises Si, C, graphite, Ti, V, Cr, Mn, Co, Fe, Ni, Cu, Ge, silicon-carbon composite/compound, Sn, tin-cobalt alloy, LTO, $Li_4Ti_5O_{12}$, $CoO_2$, $NiO_2$, $MnO_2$, $TiS_2$, $TiS_3$, $Li_xFePO_4$, or the like.

In one embodiment, the current collecting material comprises Cu, Ni, Al, or the like.

In one embodiment, the substrate comprises nanorod arrays formed of the current collecting material, such that the first surface of the at least one layer of the electrode material is substantially adhered to the substrate through the nanorod arrays.

In one embodiment, the method further includes, prior to depositing the electrode material on the current collector substrate, forming an adhesion and compliant layer on the substrate.

In one embodiment, the adhesion and compliant layer comprises nanorod arrays. In one embodiment, the adhesion and compliant layer is formed of Cr, Ti, Ni, Ta, Mo, W, or the like.

In one embodiment, the adhesion and compliant layer is a graded composite layer of the current collecting material and the electrode material, formed by co-depositing the current collecting material and the electrode material with varying compositions as a function of thickness of the graded composite layer, wherein the graded composite layer has a first surface being substantially adhered to the substrate and an opposite, second surface, and wherein ratio of the current collecting material to the electrode material of the graded composite layer is gradually changed from 100:0 at the first surface of the graded composite layer to 0:100 at the second surface of the graded composite layer by controlling their relative deposition rates.

In one embodiment, the deposition of the electrode material is performed with a PVD comprising a sputter deposition, a thermal evaporation, an electron-beam evaporation, a cathodic arc deposition, a PLD, or the like.

In one embodiment, the operating gas comprises an inert gas or a reactive gas.

In one embodiment, the density of the at least one layer of the electrode material is gradually changed from a lowest density at one of the first and second surfaces to a highest density at the other of the first and second surfaces. In one embodiment, the method further comprises forming a capping layer having a density higher than the lowest density, on the second surface of the at least one layer of the electrode material, when the density of the at least one layer of the electrode material at the second surface has the lowest density.

In another embodiment, the density of the at least one layer of the electrode material is changed in the form of one or multiple periods of a sine wave function of the distance.

In yet another embodiment, the density of the at least one layer of the electrode material is changed in the form of a rectangular function of the distance.

In one embodiment, the at least one layer of the electrode material comprises multiple layers of the electrode material formed such that layers having lower densities and layers having higher densities are alternately stacked to one another.

In another aspect of the invention, a system for fabricating an electrode having a density modulated film for a battery comprises a vacuum chamber; an operating gas in the chamber having a pressure that is controllable; a platform placed in the chamber for holding a substrate formed of an current collecting material, the platform being tiltable and rotatable; and means for depositing at least one material on the substrate to form a film in the chamber, wherein, during deposition, the pressure of the operating gas is controlled and changed to a predetermined pressure value according to a deposited thickness, so that the film has a density changed with the deposited thickness.

In one embodiment, the pressure of the operating gas is controlled and changed by throttling a gate valve between the chamber and a pump for pumping the operating gas into the chamber.

In another embodiment, the pressure of the operating gas is controlled and changed by controlling a flow rate of the operating gas into the chamber. In one embodiment, the flow rate of the operating gas into the chamber is controlled by a flow meter.

In one embodiment, the operating gas comprises an inert gas, or a reactive gas.

In one embodiment, tilt and rotation of the platform are controlled by a computer.

In one embodiment, the at least one material comprises an electrode material, and wherein the depositing means comprises a sputter gun being in communication with a source of the electrode material.

In another embodiment, the at least one material comprises a first material and a second material, and wherein the depositing means comprises a first sputter gun coupled to an RF or DC power supply and being in communication with a source of the first material, and a second sputter gun coupled an RF or DC power supply and being in communication with a source of the second material, wherein the first sputter gun and the second sputter gun are placed in the chamber at an angle.

In one embodiment, in operation, the first and second sputter guns are simultaneously activated to co-deposit the first and second materials on the substrate to form an adhesion and compliant layer first, and then the second sputter gun is deactivated and the first sputter gun continuously deposits the first material on the adhesion and compliant layer to form the film having a density changed with the deposited thickness, wherein the first material comprises an electrode material and the second material comprises the current collecting material, wherein the adhesion and compliant layer is a graded composite layer of the current collecting material and the electrode material, having a first surface being substantially adhered to the substrate and an opposite, second surface, and wherein ratio of the current collecting material to the electrode material of the graded composite layer is gradually changed from 100:0 at the first surface of the graded composite layer to 0:100 at the second surface of the graded composite layer by controlling their relative deposition rates.

In another embodiment, in operation, the second sputter gun is activated to deposit the second material on the substrate to form an adhesion and compliant layer first, and then the first sputter gun is activated to deposit the first material on the adhesion and compliant layer to form the film having a density changed with the deposited thickness, wherein the first material comprises an electrode material and the second material comprises Cr, Ti, Ni, Ta, Mo, W, or the like.

In one embodiment, the depositing means comprises a system of a PVD comprising a sputter deposition, a thermal evaporation, an electron-beam evaporation, a cathodic arc deposition, a PLD, or the like.

These and other aspects of the invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment.

FIG. 1a shows schematically a standard high density Si thin film on a substrate showing cracks propagation therein; and FIGS. 1b-1f show schematically different density modulated Si thin films on a substrate showing crack trapping therein according to embodiments of the invention

FIG. 18 is Table II listing thickness, density, porosity, and weight loading values of sputter deposited Si film samples produced at different Ar gas pressures according to embodiments of the invention. Standard deviation in the data listed is about 5%.

FIG. 19 is Table III listing computational models developed in order to characterize the stresses in density modulated film structures according to embodiments of the invention.

DETAILED DESCRIPTION OF THE INVENTION

Figure 2:
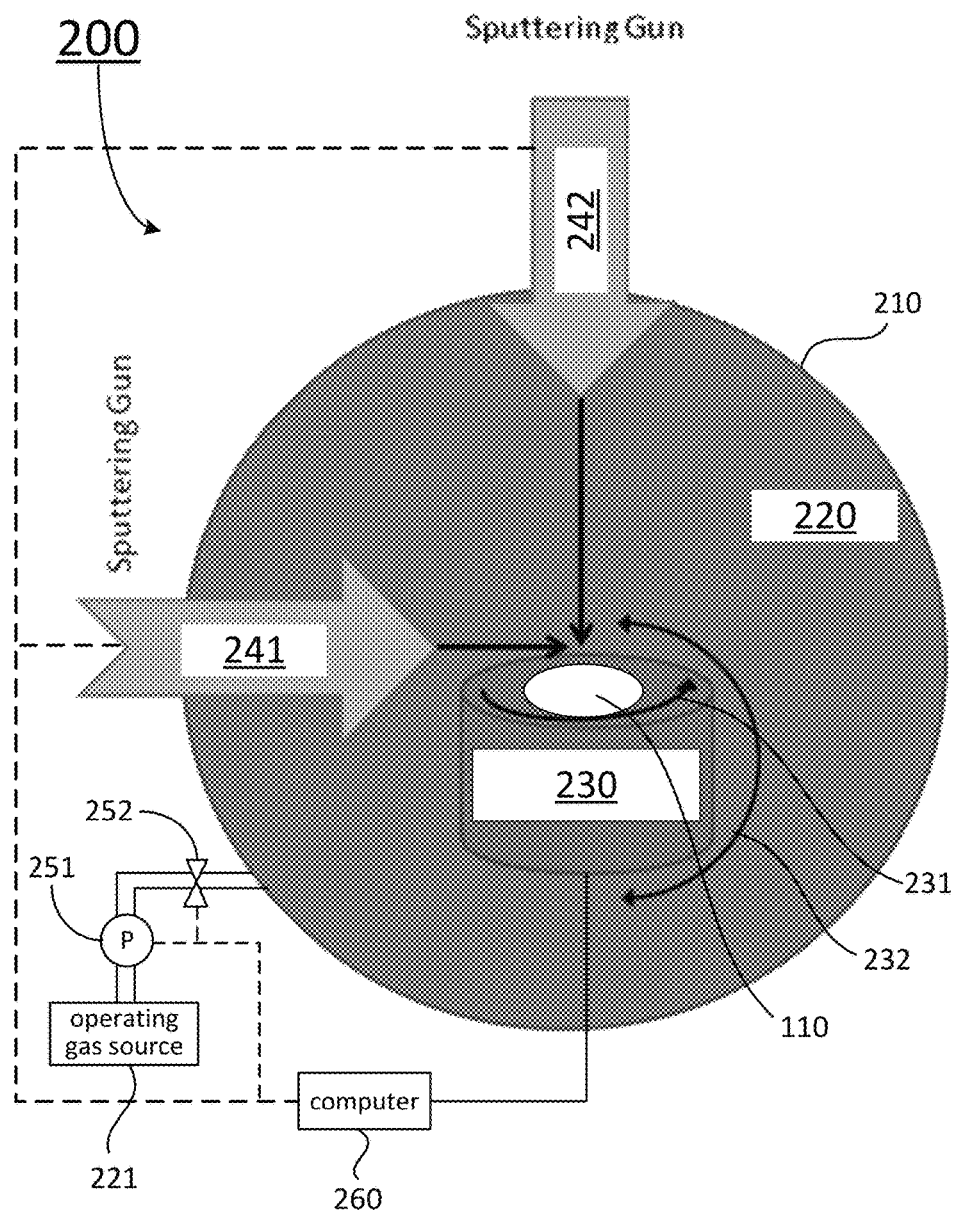
FIG. 2 shows schematically a multi-source sputter deposition system used for growth of a density modulated thin film and an adhesion layer according to one embodiment of the invention. Substrate can be rotated azimuthally around its axis for improved coating uniformity or tilted towards either of the sources for sequential deposition.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

The description will be made as to the embodiments of the invention in conjunction with the accompanying drawings. In accordance with the purposes of this disclosure, as embodied and broadly described herein, this disclosure, in certain aspects, relates to density modulated thin film electrodes, methods of making the same, and applications of the same.

According to the invention, the density modulated film electrodes includes one or more electrode material layers with varying densities, either in the form of alternating high/low densities or graded densities, and have the ability to tolerate high volume change, stress evolution, and cracking during lithiation/delithiation, which provide enhanced film stability, better adhesion to the current collector, and improved control over the solid-electrolyte interface (SEI) layer formation. In addition, the invention utilizes a simple yet novel approach of physical vapor deposition method such as sputter deposition or thermal evaporation for the fabrication of density modulated thin films and electrodes including the thin films with stress-compliant and pulverization-resistant properties. Furthermore, several methods of adhesion layers including graded composite film and glancing angle deposited (GLAD) nanorod arrays are employed to improve the adhesion strength of the density modulated thin films.

In certain embodiments, as shown in FIGS. 1b-1f, the density modulated thin film 120 includes at least one layer formed of an electrode material. The at least one layer has a first surface 121 and an opposite, second surface 122, and a density that is changed with a distance, D, defined from the first surface 121 to a plane 125 in the at least one layer. The plane 125 is parallel to the first surface 121. The distance D has a maximal value corresponding to a thickness of the at least one layer defined between the first and second surfaces 121 and 122.

In one embodiment, as shown in FIGS. 1b and e, the density is gradually changed from a highest density at the first surface 121 to a lowest density at the second surface 122. In another embodiment, the density is changed in the form of one or multiple periods of a sine wave function of the distance. In yet another embodiment, as shown in FIGS. 1c, 1d and 1f, the density is changed in the form of a rectangular function of the distance.

In certain embodiments, as shown in FIGS. 1c, 1d and 1f, the at least one layer 120 of the electrode material comprises multiple layers of the electrode material formed such that layers having lower densities 123 and layers having higher densities 124 are alternately stacked to one another.

According to the invention, the electrode material can be elemental one as well as its compounds, alloys, oxides, sulfides, and the like. Exemplary electrode material includes, but is not limited to, silicon (Si), carbon (C), graphite, titanium (Ti), vanadium (V), chromium (Cr), manganese (Mn), cobalt (Co), iron (Fe), nickel (Ni), copper (Cu), germanium (Ge), silicon-carbon composite/compound, tin (Sn), tin-cobalt alloy, lithium titanate (LTO, $Li_4Ti_5O_{12}$), cobalt oxide ($CoO_2$), nickel oxide ($NiO_2$), manganese oxide ($MnO_2$), titanium sulfide ($TiS_2$, $TiS_3$), or $Li_xFePO_4$.

In another aspect of the invention, the method for fabricating the density modulated thin film includes during deposition of the electrode material, controlling and changing a pressure of an operating gas to a predetermined pressure value according to a deposited thickness of the electrode material. As such, the deposited thin film has the density changed with the distance. The operating gas can be an inert gas or a reactive gas. In certain embodiments, the deposition of the electrode material is performed with a physical vapor deposition (PVD) including, but is not limited to, a sputter deposition, a thermal evaporation, an electron-beam evaporation, a cathodic arc deposition, or a pulsed laser deposition (PLD).

Also referring to FIGS. 1b-1f, as an application of the density modulated thin film 120, it can be stacked on a current collector such as a substrate 110 formed of a current collecting material to form a battery electrode with superior specific capacity and cycling stability. The current collecting material includes, but is not limited to, copper (Cu), nickel (Ni), aluminum (Al), or the like.

In certain embodiments, the density of the density modulated thin film is gradually changed from a lowest density at one of the first and second surfaces to a highest density at the other of the first and second surfaces, e.g., shown in FIGS. 1b and 1e. In certain embodiments, as shown in FIG. 18, the electrode further includes a capping layer 140 having a density higher than the lowest density, formed on the second surface 121 of the at least one layer (i.e., density modulated thin film) 120 of the electrode material, when the density of the at least one layer 120 of the electrode material at the second surface 121 has the lowest density, wherein the capping layer 140 is formed of a material that is same as the electrode material of the at least one layer (i.e., density modulated thin film) 120.

In certain embodiments, the density is changed in the form of one or multiple periods of a sine wave function of the distance, or in the form of a rectangular function of the distance, e.g., shown in FIGS. 1c, 1d and 1f.

In certain embodiments, the density modulated thin film 120 comprises multiple layers of the electrode material formed such that layers having lower densities 123 and layers having higher densities 124 are alternately stacked to one another, as shown in FIGS. 1c, 1d and 1f.

To improve the adhesion strength of the density modulated thin film to the substrate (current collector) in the battery electrode, the invention provides several exemplary approaches, for example:

In certain embodiments, the substrate is provided with nanorod arrays formed of the current collecting material, such that the first surface of the density modulated thin film is substantially adhered to the substrate through the nanorod arrays.

In certain embodiments, an adhesion and compliant layer 130 is formed between the substrate 110 and the density modulated thin film 120, as shown in FIGS. 1e and 1f.

In certain embodiments, the adhesion and compliant layer 130 comprises nanorod arrays, as shown in FIG. 1f, formed of a material such as, but is not limited to, chromium (Cr), titanium (Ti), nickel (Ni), tantalum (Ta), molybdenum (Mo), or tungsten (W).

In certain embodiments, the adhesion and compliant layer 130 is a graded composite layer of the current collecting material and the electrode material, as shown in FIG. 1e, formed by co-depositing the current collecting material and the electrode material with varying compositions as a function of thickness of the graded composite layer. As shown in FIG. 1e, the graded composite layer 130 has a first surface being substantially adhered to the substrate 110 and an opposite, second surface being substantially adhered to the first surface 121 of the at least one layer 120 of the electrode material. A ratio of the current collecting material to the electrode material of the graded composite layer is gradually changed from 100:0 at the first surface of the graded composite layer to 0:100 at the second surface of the graded composite layer by controlling their relative deposition rates.

For fabrication of the battery electrode having the density modulated thin film as disclosed above, the invention provides a method that includes providing the substrate formed of the current collecting material, and depositing the electrode material on the substrate to form the density modulated thin film. The essence of the method is during deposition of the electrode material, to control and change a pressure of an operating gas to a predetermined pressure value according to a deposited thickness of the electrode material. As such, the deposited thin film of the electrode material has the density changed with the distance. The operating gas can be an inert gas or a reactive gas. In certain embodiments, the deposition of the electrode material is performed with the PVD including, but is not limited to, a sputter deposition, a thermal evaporation, an electron-beam evaporation, a cathodic arc deposition, or a PLD.

Similarly, the following steps may be employed to improve the adhesion strength of the density modulated thin film to the substrate (current collector) in the battery electrode.

In certain embodiments, the step of providing the substrate may include forming nanorod arrays of the current collecting material on a surface of the substrate, such that the first surface of the density modulated thin film is substantially adhered to the surface substrate through the nanorod arrays.

In certain embodiments, the method further includes, prior to the step of depositing the electrode material on the substrate, forming an adhesion and compliant layer on the substrate.

In certain embodiments, the adhesion and compliant layer includes nanorod arrays formed of a material such as, but is not limited to, Cr, Ti, Ni, Ta, Mo, or W.

In certain embodiments, the adhesion and compliant layer is a graded composite layer of the current collecting material and the electrode material, formed by co-depositing the current collecting material and the electrode material with varying compositions as a function of thickness of the graded composite layer. The graded composite layer has a first surface being substantially adhered to the substrate and an opposite, second surface being substantially adhered to the first surface of the at least one layer of the electrode material. A ratio of the current collecting material to the electrode material of the graded composite layer is gradually changed from 100:0 at the first surface of the graded composite layer to 0:100 at the second surface of the graded composite layer by controlling their relative deposition rates.

Referring to FIG. 2, a system 200 for fabricating an electrode having a density modulated film for a battery is schematically shown according to one embodiment of the invention. The system 200 comprises a vacuum chamber 210, an operating gas 220 in the chamber 210 having a pressure that is controllable, a platform (also known as substrate holder) 230 placed in the chamber 210 for holding a substrate 110 formed of an current collecting material, the platform 230 being tiltable along a direction 232 and rotatable along a direction 231, and means 241 and/or 242 for depositing at least one material on the substrate 110 to form a film in the chamber 210. During deposition, the pressure of the operating gas 220 is controlled and changed to a predetermined pressure value according to a deposited thickness, so that the film has a density changed with the deposited thickness. In one embodiment, the operating gas 220 comprises an inert gas such as Ar gas, or a reactive gas.

In one embodiment, the pressure of the operating gas 220 is controlled and changed by throttling a gate valve 252 between the chamber 210 and a pump 251 for pumping the operating gas 229 from an operating gas source 221 into the chamber 210. In another embodiment, the pressure of the operating gas 220 is controlled and changed by controlling a flow rate of the operating gas 220 into the chamber 210. In one embodiment, the flow rate of the operating gas 220 into the chamber 210 is controlled by a flow meter.

In one embodiment, tilt 232 and rotation 231 of the platform 230 are controlled by a computer 260. In addition, the operations of the depositing means 241 and/or 242, the gate valve 252 and the pump 251 may also be controlled by the computer 260.

In one embodiment, the at least one material comprises an electrode material, and wherein the depositing means comprises a sputter gun 241 or 242 being in communication with a source of the electrode material.

In another embodiment, the at least one material comprises a first material and a second material. The depositing means comprises a first sputter gun 241 coupled to an RF or DC power supply and being in communication with a source of the first material, and a second sputter gun 242 coupled an RF or DC power supply and being in communication with a source of the second material. The first sputter gun 241 and the second sputter gun 242 are placed in the chamber 210 at an angle.

In one embodiment, in operation, the first and second sputter guns 241 and 242 are simultaneously activated to co-deposit the first and second materials on the substrate 110 to form an adhesion and compliant layer first, and then the second sputter gun 242 is deactivated and the first sputter gun 241 continuously deposits the first material on the adhesion and compliant layer to form the film having a density changed with the deposited thickness. The first material comprises an electrode material and the second material comprises the current collecting material. The adhesion and compliant layer is a graded composite layer of the current collecting material and the electrode material, having a first surface being substantially adhered to the substrate 110 and an opposite, second surface, and wherein ratio of the current collecting material to the electrode material of the graded composite layer is gradually changed from 100:0 at the first surface of the graded composite layer to 0:100 at the second surface of the graded composite layer by controlling their relative deposition rates.

In another embodiment, in operation, the second sputter gun 242 is activated to deposit the second material on the substrate to form an adhesion and compliant layer first, and then the first sputter gun 241 is activated to deposit the first material on the adhesion and compliant layer to form the film having a density changed with the deposited thickness, wherein the first material comprises an electrode material and the second material comprises Cr, Ti, Ni, Ta, Mo, W, or the like.

In one embodiment, the depositing means comprises a system of a PVD comprising a sputter deposition, a thermal evaporation, an electron-beam evaporation, a cathodic arc deposition, a PLD, or the like.

These and other aspects of the invention are further described below, mostly using the electrode material such as Si, the current collecting material such as Cu, the adhesion and complaint material such as Cr as exemplary materials without intent to limit the scope of the invention. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Stress Reduction and Enhanced Mechanical Stability

Poor mechanical stability of silicon anode, which is due to the expansion of intercalated Si, leads to low reversible capacity values. Previous research on a-Si (amorphous Si) thin film anodes showed that transformation from amorphous to crystalline phase occurs during lithiation and back to the amorphous structure during delithiation. However, extraction of Li ions from lithiated crystalline Li—Si structure leads to high tensile stress in the film [39]. When this stress becomes higher than the tensile strength of a-Si, the change of the crystalline structure to amorphous is followed by the cracks and agglomeration within Si thin film (illustrated in FIG. 1a). Further capacity loss typically occurs after several cycling of expansion/contraction of the anode during lithiation/delithiation. Moreover, electronic contact along cracks in Si thin film is lost, which has a significant effect on the capacity. Finally, delimitation of the Si thin film occurs after several cycling, and the electrode malfunctions. Recent work by Li et al. [40] reported that mechanical fragmentation starts to occur in a-Si thin films during lithiation/delithiation when the thickness of the film is thicker than about 100-200 nm, which was calculated using Griffith's [41] energy criteria. According to the Griffith's criteria, if the surface energy of the cracked Si is lower than the strain energy of the thin film, the cracking becomes possible.

In order to overcome the mechanical stability problems described above, in one aspect, this invention provides a new approach of density modulated multilayer Si thin films with stress compliant properties. It was demonstrated that the structural properties of density modulated multilayer thin films by a high/low working gas pressure sputter deposition approach provide films with low intrinsic stress, high mechanical stability, and controlled density (porosity) [38a, 38b], which is much desired for battery applications. Multilayer Si thin films developed in this invention include high and low material density layers, where each low density layer acts as compliant that can relax the stress build-up and limits the crack propagation upon volume change during Li insertion/extraction (FIGS. 1c, 1d and 1f). Higher porosity and surface/volume ratio of the films provided by low density layers also result in lower overall volume expansion of the film and stress. The high porosity of low density layers also makes the diffusion of Li ions into the electrode easier and provides porous pathways for fast Li intercalation/de-intercalation. On the other hand, denser films are expected to accommodate more Li ions (i.e., due to more Si atoms per film volume) and have better electronic conductivity, yet they are more susceptible to mechanical fragmentation, and lithium diffusion can be more difficult due to the denser structure. Therefore, using high and low density films together can combine their advantageous properties for an optimal Si thin film anode material. In addition to these, use a doped Si source (e.g., sputter target) can produce electrically more conductive Si films [31c].

The principle of the density modulated Si thin films is illustrated in FIGS. 1a-1f Cracks, delamination, and pulverization commonly occur in conventional Si thin film anodes as a result of the conversion of crystalline $Li_{15}Si_4$ to amorphous Si during Li extraction, followed by about a 3 to 4 times volume contraction as also explained above (FIG. 1a) [16b, 36]. Conventional Si thin films also have two-phase regions after delithiation with large crystalline grain sizes. On the other hand, in density modulated multilayer Si thin films (FIGS. 1c, 1d and 1f), crack propagation is expected to be trapped locally within high density layers due to the neighboring porous low density layers that have high tolerance against stress. In other words, it takes more energy for cracks to propagate through a porous network. Therefore, cracks follow irregular random paths instead of travelling through the film/substrate interface, which normally occurs in conventional high-density films leading to delamination or pulverization of the whole film. Therefore, the crack propagation in density modulated Si film anodes can be seized within the film among the high/low density layers, and thus preventing further fragmentation and failure of the whole film.

In another aspect of the invention, an alternative density modulated film fabrication approach is growth of a graded density film that is obtained by the gradual pressure change during sputter deposition (FIGS. 1b and 1e). In one embodiment, having a graded density film with a high density at the top and lowest at the bottom provides a gradual volume expansion/contraction of the anode film being maximum at the top and minimum at the bottom during lithiation/delithiation. This offers a better volume change matching with the substrate material and leads to enhanced mechanical stability [73]. In another embodiment, having low density with a more porous structure at the top portion of the film allows fast Li-ion diffusion while the higher density at the bottom provides better adhesion to the substrate. Both alternatives are investigated. In addition, the change in the density can also be made of one or multiple periods of a sine wave.

Controlling the Solid Electrolyte Interface (SEI) Layer Formation

SEI layer formation has been one of the most important research topics in Li-ion batteries. SEI formation in carbon anodes has been well studied and mechanisms are explained in detail [42]. Irreversible specific capacity values at the initial cycles of carbon anodes are attributed to the formation of SEI layer. On the other hand, detailed analysis of SEI layer formation for elemental Si anode materials such as using galvanostatical methods has not been reported in the literature [12]. Therefore, SEI phenomena for Si anodes have not been completely comprehended yet, and further studies are necessary. SEI layer allows the passage of Li ions while blocking that of electrons, which hinders the undesired side reactions during charging/discharging. However, too much formation of SEI layer such as in the case of porous electrode materials can cause overconsumption of Li ions from the electrolyte, reduced diffusion rate of Li ions and fragmentation of SEI layer during charging/discharging due to the volume expansion coefficient mismatch with the underlying Si electrode, which lead to battery instability and failure.

No practical methods have been found to avoid extensive SEI formation so far [11]. Si suffers from SEI formation more than other anode materials (e.g., carbon) because the SEI layer on Si is not stable and continues on fragmentation-rebuilt at each cycle. High volume change of Si plays the biggest role on the fragmentation of SEI layer. In addition, increased surface to volume ratio of porous or nanostructured Si anode materials can also become a disadvantage. Although porous structures allow fast diffusion of Li ions into the anode structure, undesired side reactions on the high surface area can cause too much formation of SEI layer [11]. For that reason, SEI layer formation in Si should be controlled and kept stable during charging-discharging processes. In this sense, the hypothesis is that denser thin films are considered to be more advantageous over porous/nanostructure Si anodes from the point of more controlled SEI formation. In dense thin films, SEI layer cannot reach deep into the coating and only covers the top apparent surface.

As discussed above, dense and porous Si films have their own advantages and disadvantages regarding controlled stress and SEI formation. Therefore, the method of density modulated Si film anodes can potentially combine the advantages of dense and porous thin films. By introducing special designs in the density modulation within the film, the formation of SEI layer can be controlled to desired values. For example, one can fabricate density modulated Si films with a high density capping layer at the top by simply changing working gas pressure to low values. This high density capping layer can block the passage of electrolyte solution and act as a self-protection layer towards further SEI formation at underlying porous layer within the film. Therefore, density graded films (FIGS. 1b and 1e) that start with a porous low-density structure from the current collector substrate and end up with a dense layer at the top can be more advantageous in limiting the SEI layer formation. In the case of a graded film, which has a higher density at the bottom and lower density at the top, one can add a thin high-density capping layer.

Adhesion Improvement

Pulverization and delamination of thin films from the substrate during charge-discharge cycling is a major problem since it causes sudden failure of the battery. The problem with Si can be worse because of its weaker adhesion with current collector substrate materials such as Cu. Therefore, the adhesion of Si thin films on substrate should be enhanced for high cycling stability. Several methods were investigated for this purpose. Increasing the surface area between the substrate and film is believed to improve the adhesion strength. In a study by Lee et al. [37], films on roughened Cu foils provided better capacity performance than those of smoother foils. Li et al. [32b] also reported improved cycling performance of Si thin films on high surface area Cu foam, which provides a stronger adhesion with the film. In some cases, instead of improving the adhesion strength with the substrate, Si film can be fabricated to have a non-continuous structure so that it can allow extra space for volume expansion. This can eventually improve the adhesion stability of the film after charging/discharging cycles. For example, pre-produced cracks in Si thin film anodes were shown to be providing longer cycle life than the conventional thin films [40]. In another work, deposition of patterned Si thin films was shown to provide better battery performance [43]. However, in these studies film thickness and maximum cycle number values were quite limited. Therefore, further research for adhesion improvement is necessary for practical Li-ion battery applications.

In microelectronics, use of adhesion layers such as tantalum (Ta) between Si and Cu is very common [44]; yet, similar approaches for adhesion improvement have not been studied in detail for Li-ion battery electrodes. Using alternative current collector materials with better adhesion to Si, instead of an adhesion layer, has been recognized. For example, nickel (Ni) foils has been shown to provide a better integration of Si films [31b]. However, Cu still has the advantage of having a very high electronic conductivity compared to other current collector candidate materials. For this reason, in this invention, one can utilize Cu current collector substrates with a thin adhesion layer coating, which can significantly improve the adhesion strength of Si while keeping the overall fabrication costs down. In certain embodiments, we can fabricate thin film coatings of different adhesion layer materials including chromium (Cr), titanium (Ti), Ni, and Ta, and compare their effects on the adhesion strength and battery stability of Si film anode. One can study these materials by changing their thicknesses and investigate their adhesion strength to Si films by a Scotch tape method [38b]. After identifying the best adhesion material, one can use it for the fabrication of advanced Si films with superior mechanical stability.

As an alternative new approach, in this invention, we introduce a nanostructured adhesion and compliant layer between Si film and Cu current collector. This nanostructured layer can provide a high surface area for better adhesion, and at the same time act as a compliant layer that can reduce the stress evolving at the Si film during battery charging/discharging [38a, 38c, 45]. In this invention, we can fabricate nanorod arrays of the material with best adhesion to Si (i.e., either of Cr, Ti, Ni, Ta that can be compared in the adhesion study explained above). Nanorod array fabrication can be achieved using a glancing angle deposition (GLAD) technique [46].

On the other hand, thin film or nanostructured adhesion layers made of materials such as Cr, Ti, Ni, and Ta might potentially suffer from corrosion in the acidic Li-ion battery electrolyte environment to some extent although it is not directly exposed to the electrolyte [47]. As an alternative approach, we can fabricate nanostructured adhesion and compliant layer that will be made of the GLAD Cu nanorod arrays. Cu nanorods are expected to be more resistant to corrosion and stick well to the underlying Cu substrate while providing a high surface area to the Si film anode for improved adhesion and stress compliance.

In certain aspects of the invention, a graded Si—Cu composite film adhesion layer is fabricated by co-sputter deposition of Si and Cu with varying compositions as a function of thickness. This approach starts with coating Cu current collector with 100-0 ratio of Cu/Si and gradually changing this to 0-100 by controlling their relative deposition rates. The approach provides a strong adhesion with the Si film anode, avoids possible problems such as corrosion associated with additional adhesion layers, and at the same time leads to better stress management between the anode and current collector [45]. In certain embodiments, volume change during lithiation/delithiation can be gradually controlled from Si film down to Cu collector through the graded Si—Cu composite layer.

Fabrication of Thin Films

Density Modulated Si Thin Films by Sputter Deposition:

In certain aspects of the invention, density modulated multilayer Si thin films are deposited using a DC/RF magnetron sputter deposition technique. In certain embodiments, structure and morphology of the films made by sputtering are controlled depending on several parameters such as substrate temperature, pressure, and sputter power. These deposition parameters affect "shadowing" and surface diffusion processes during film growth and determine the final film microstructure as described in the well-known "structural zone model" (SZM) [48a]. During sputter deposition atoms can approach substrate surface at a broad range of angles. Deposition starts with small agglomeration of atoms and formation of islands. Due to the angular distribution of the incident flux of source atoms, islands of higher height capture the atoms approaching with more oblique angles, allowing them to grow faster compared to other neighboring surface sites that are being shadowed because of their shorter height. The so called "shadowing effect" [49] results in the growth of columnar films, which is more pronounced in the formation of nanorod arrays by the GLAD technique that will be explained in the following section. Shadowing effect during sputter deposition is strongly related to the working gas pressure. This originates from the "mean free path" [50] of sputtered source atoms, which defines the average distance value they can travel without collision. At high working gas pressures, atoms go through more collisions due to the denser gas causing lower mean free path values. Lower mean free path corresponds to source atoms being deposited in a wider range of angles that leads to stronger shadowing effect, more columnar microstructure, and lower film density [51]. Therefore, by simply controlling the gas pressure during sputter deposition, one can introduce high and low density films by setting pressure to low and high values, respectively [38]. Another important parameter during film deposition is the surface diffusion of atoms. Shadowing effect tends to increase the film roughness while surface diffusion helps having smoother surfaces. However, it has been shown that shadowing effect generally dominates over surface diffusion effects [52]. Therefore, by controlling the gas pressure during sputter deposition, it is possible to introduce high and low density films having low and high surface roughness, respectively. In the formation of density modulated films according to embodiments of the invention, the working gas pressure is changed during deposition, and is alternated between high and low values. This provides films having multilayers of low and high density microstructure, as well as having high and low surface roughness.

In certain embodiments of this invention, high/low working gas pressure procedure described above is used in order to produce density modulated sputter deposited Si films incorporating alternating low/high material density layers. In one embodiment, a low density layer is fabricated first, which is then followed by a high density one, and so on (FIGS. 1c, 1d and 1f). In another embodiment, graded density films are grown starting with a high or low working gas pressure and gradually decreasing/increasing it to lower/higher values, respectively, which can give the microstructure illustrated in FIGS. 1c and 1e.

Low operating gas pressure provides dense films, while at high pressures a thin film has a low-density microstructure [38b]. Intrinsic stress also changes by varying pressure values. For instance, low-pressure sputter deposited films have higher compressive stress compared to high-pressure films [38b]. This is due to that at low pressures, source and working gas atoms can deposit at more normal angles and with higher kinetic energies pinning into the film and causing compressive stress [51]. On the other hand, low density sputter films produced at higher working gas pressures typically have tensile or negligible compressive stress values. Tensile stress in low density films is due to the atom-atom attraction forces at locations of atomic voids. When these voids become larger such as in the case of lower density films of higher gas pressures, film can become nanostructured and compliant with almost zero stress (i.e., low stress values <50 MPa). Therefore, according to the invention, low density layers in the density modulated Si films act as compliant components lowering the intrinsic stress [38a, 38b], tolerating increase in the stress during lithiation, and therefore providing a thicker and more stable anode material.

Nanorod Arrays by Glancing Angle Deposition (GLAD) Technique:

In certain embodiments, fabrication of the nanostructured adhesion and compliant layer is achieved by a glancing angle deposition (GLAD) method. The GLAD method, which is also called oblique angle deposition, provides a novel capability for growing 3D nanostructure arrays with interesting material properties [53]. During the GLAD, a flux of atoms is incident on a rotating substrate (around its substrate normal) at oblique angles, generally higher than 70°. Similar to the high-pressure induced "shadowing effect" in sputter deposition, the GLAD technique also uses the same effect but this time through an obliquely incident flux. Shadowing effect during the GLAD introduces "physical self-assembly" through which some of the obliquely incident atoms may not reach certain points on the substrate due to the concurrent growth of parallel nanorod structures [46, 54]. In certain embodiments, the shadowing effect is controlled by adjusting the deposition rate, incidence angle, substrate rotation speed, working gas pressure, substrate temperature, and the initial surface topography of the substrate. The GLAD is a single step physical self-assembly growth technique that can produce arrays of nanostructures directly on a given substrate without need for any lift-off or additional processing steps. The nanostructures can be produced with a very large aspect ratio and controllable porosity, shape, and symmetry, which are characteristics that are not easily attainable by other techniques. It is very robust in that practically any elemental material or a combination of materials (e.g., alloys, oxides, compounds) can be used for fabrication. In addition, the GLAD nanostructures can be deposited on almost any type of substrate material and substrate morphology.

Using the GLAD technique, nanorod arrays that are made of such as Cu, Cr, Ti, Ni, and Ta, can be fabricated as discussed above. For the GLAD, the same sputter deposition system can be used for the fabrication of density modulated Si films, which utilizes a substrate modulator with a 3D tilt and rotation capability. In certain embodiments, simultaneous sample rotation and tilting with respect to the incident flux are achieved by two independently controlled motors.

Utilization of Physical Vapor Deposition (PVD) Thin Film Fabrication Techniques:

In the invention described above, we described the fabrication process mainly focusing on the sputter deposition technique, which is a type of physical vapor deposition (PVD). However, other PVD techniques can also be utilized to practice the invention. These alternative PVD techniques include, but are not limited to, thermal evaporation, electron-beam (e-beam) evaporation, and pulsed laser deposition (PLD). In those alternative techniques, one can introduce an inert gas such as Ar during deposition in order to change and control the working gas pressure. In certain embodiments, during e-beam evaporation one can introduce Ar gas at relatively high pressures that would decrease the mean free path of evaporated silicon atoms and result in the formation of a low density Si film. This can be followed by reducing or turning off the Ar flow in order to form a dense Si layer. Therefore, all the approaches describe above can be implemented in any PVD system by simply introducing and controlling the pressure of an inert gas during deposition.

Electrode Materials Other than Silicon:

All the new methods and procedures disclosed above can also be implemented to other electrode materials for Li-ion batteries. Silicon has been the focus of this invention due to its attractive capacity properties for Li-ion batteries. However, any material that can be grown by PVD techniques and used for Li-ion batteries as an electrode material can also be utilized to practice the invention.

Without intent to limit the scope of the invention, exemplary examples and their related results according to the embodiments of the invention are given below.

Example 1

Cycling Performance of Density Modulated Multilayer Silicon Thin Film Anodes in Li-Ion Batteries The high volumetric expansion/contraction of silicon (Si) anodes in Li-ion batteries by about 400% during lithiation/delithiation causes considerably high stress followed by cracking, pulverization, and the loss of electrical contact; and finally results in capacity fading and failing. In this work, we present a density modulated multilayer Si thin film anode approach, which can provide a robust high capacity electrode for Li-ion batteries. Alternating high and low density layers have been achieved by simply changing the working gas pressure between low and high values, respectively during magnetron sputter deposition of Si thin film anodes. Our results reveal that density modulated Si films can provide a high coulombic efficiency up to 99% and reversible specific capacity as high as about 1700 mAh g$^{-1}$ after 50 cycles. Low-density layers serve as compliant layers during volume change making the films more durable compared to conventional Si film anodes. The results can lead to Si thin film anode materials with superior capacity and mechanical stability compared to conventional Si anodes.

In this study, we report on the development of a density modulated Si thin film approach as the anode material for Li-ion batteries with high capacity and cycling stability. These films include Si layers with varying densities and have the ability to tolerate high volume change, stress evolution, and cracking during lithiation/delithiation. This is believed to provide enhanced film stability and better adhesion to the current collector. It was demonstrated that the structural properties of density modulated multilayer thin films by a high/low working gas pressure sputter deposition method provide films with low intrinsic stress, high mechanical stability, and controlled density (porosity),[38a, 38b] which is much desired for battery applications. Multilayer Si thin films proposed in this study are composed of high and low material density layers, where each low density layer acts as compliant that can relax the stress build-up and limits the crack propagation upon volume change during Li insertion/extraction.

Structure and morphology of the films made by sputtering can be controlled depending on several parameters such as temperature, pressure, and voltage. In addition to these, shadowing effect and surface diffusion process are also some important constraints which are described in the well-known "structural zone model (SZM)" [48a] Because of collisions and re-scattering of source atoms as they pass through the working gas (e.g., Ar) and plasma, not all of the atoms come to the substrate directly, and the deposition occurs in a very broad range of angles. At high working gas pressures, atoms go through more collisions due to the denser gas causing lower mean free path values leading to deposition of low density thin films. Therefore, by simply controlling the gas pressure during sputter deposition, one can introduce high and low density films by setting pressure to low and high values, respectively.

1.1 Experimental

Fabrication of Density Modulated Silicon Thin Films:

Single and density modulated multilayer silicon thin films were deposited using a multi-source RF/DC magnetron sputtering system (Excel Instruments, India). As illustrated in FIG. 2, the system 200 had two magnetron sputter guns 241 and 242 one attached to a DC and the other one to an RF power supply and housing silicon and chromium (Cr) sputter targets, respectively. The substrate modulator (platform) 230, which was at a distance of about 6 inches from the sputter targets 241 and 242, had the substrate tilt 232 and rotation 231 capability controlled by a computer 260. It allowed tilting the substrate 230 towards the desired sputter guns 241 or 242 giving the ability to deposit two different materials after one another. Substrate rotation 231 around the surface normal central axis was utilized to further improve the deposited film thickness uniformity. Circular copper (Cu) foil current collectors were used as substrates for half-cell Li-ion battery tests. Diameter and thickness of Cu foil pieces were 0.5 inches and about 10$^{-3}$ inches (25 micron), respectively. During depositions, quartz crystals (6 MHz, AT cut) and Si wafer pieces (University Wafers, 380 micron, polished) were also included as additional substrates along with Cu foils for the purpose of film density measurements and more convenient cross-sectional scanning electron microscopy (SEM, JEOL—JSM7000F) imaging of the Si thin films, respectively.

A p-type silicon target (Kurt Lesker) with 99.99% purity, diameter of 2 inches, and thickness of 0.125 inch was used as the material source for Si thin films. The p-Si target was used due to the fact that doped silicon films have been shown to provide better electronic conductivity and improved electrochemical performance [31a]. A base vacuum pressure of about 3×10$^{-6}$ mbar (about 2.3×10$^{-6}$ Torr) was attained using a turbomolecular pump backed by a mechanical pump. An ultra-high purity Ar (99.999% purity, Airgas) was used as the operating gas for generating the plasma. Samples were rotated along the central axis of substrate holder at 5 RPM in order to improve the thickness uniformity of deposited films. Cr target (Kurt Lesker) had a purity of 99.95%, diameter of 2 inches, and thickness of 0.125 inch. A thin Cr initial layer of about 25 nm thickness was DC-sputter deposited on Cu foils at normal incidence, 150 W power, 2×10$^{-3}$ mbar (1.5×10$^{-3}$ Torr) Ar pressure, and for 2 minutes in order to improve the adhesion of Si thin films to the Cu substrate. Right after the deposition of Cr adhesion layer, sample holder was turned toward the Si target, and silicon thin films were RF-sputter deposited at normal incidence and at 200 W. This sequential deposition of Cr and Si layers without breaking the vacuum avoids surface oxidation on the Cr/Si interface and provides stronger adhesion and higher electrical conductivity. We did not introduce substrate heating making the process a room-temperature deposition technique.

As described before, thin films with different densities can be produced by controlling working gas pressure values during sputter deposition. Low working gas pressures leads to conventional high density films, while high working pressures cause more porous low density thin films [38a, 38b, 38c]. Therefore, it is possible to produce density modulated multilayer Si films including low/high material density layers by simply changing the working gas pressure during deposition. In this study, Ar (working gas) pressure value of high density layers was set to 1.5×10$^{-3}$ mbar (1.1×10$^{-3}$ mTorr), while the pressure for low density layers was 1.5×10$^{-2}$ mbar (1.1×10$^{-2}$ mTorr). The Ar pressure is controlled by throttling a gate valve between the turbo pump and chamber. The Ar flow rate was 10 sccm and kept constant controlled by a flow meter. Deposition rates were measured using the analysis of cross-sectional SEM images, and found to be about 6.1 nm/min and about 2.8 nm/min for high density (low Ar pressure) and low density (high Ar pressure) layers, respectively. In this study, we started with a high-density layer (low Ar pressure) followed by a low density (high Ar pressure) when preparing the density modulated multilayer Si thin film anodes (e.g., Cu/Cr/high-density-Si/low-density-Si/high-density-Si/low-density-Si/for the 4-layer density modulated sample). On can also start with a low density (high Ar pressure) followed by a high-density layer (low Ar pressure) when preparing the density modulated multilayer Si thin film anodes.

Mass Loading Measurements:

Measuring the weight of thin film and nanostructured coatings can be quite challenging due to their low loading values that typically can range from nanogram to microgram scales. Therefore, small errors in weight measurements of a thin film battery electrode may highly affect the specific capacity value, and for that reason, these measurements should be very sensitive. Some researchers estimated the weight and density of the thin film Si anodes using the theoretical density of Si (2.33 g/cm$^3$) and the thickness values measured from SEM images [31a, 32, 69]. However, theoretical density value can be appropriate only for high density films deposited such as by low-working-gas-pressure sputter deposited thin films. Density of the film can significantly decrease as the working pressure increases. Therefore, in order to accurately measure the mass loading and calculate the material density of our samples, a quartz crystal microbalance system (QCM) was employed [68]. Frequency values of quartz crystals, which were placed near Cu substrates, were measured before and after the depositions, and mass loadings were calculated using Sauerbrey equation [67].

$$\frac{\Delta m}{A} = \frac{N_q \rho_q}{\pi Z f_L} \tan^{-1}\left[Z \tan\left(\pi \frac{f_U - f_L}{f_U}\right)\right] \quad (1)$$

Equation (1) can be used to calculate the mass of a thin film (i.e., mass change ΔM on quartz crystal with units of grams) per unit area using frequency of coated crystal ($f_L$, Hz), frequency of bare crystal ($f_U$, Hz), frequency constant for AT-cut quartz crystal ($N_q$, 1.668×10$^{13}$ Hz·Å), piezoelectrically active crystal area (A, cm$^2$), density of quartz ($\rho_q$=2.648 g/cm$^3$), Z value (explained below), shear modulus of quartz ($\mu_q$=2.947×10$^{11}$ g/cm·s$^2$), and shear modulus of film ($\mu_f$, g/cm·s$^2$). Therefore, as the deposition area and the frequencies are known, the weight of the sample can be determined precisely.

Z value is determined as follows:

$$Z = \sqrt{\frac{\rho_q \mu_q}{\rho_f \mu_f}} \quad (2)$$

Film density was then calculated by dividing the measured mass loading to the film volume that was calculated using film thickness values obtained from cross-sectional SEM analysis. The QCM method provides a nanograms sensitivity, which allows precise film density measurements.

Structural Characterization and Battery Tests:

Elemental composition analysis was done by energy dispersive X-ray spectroscopy (EDS) attached to the SEM unit. θ-2θ scan X-ray diffraction (XRD, Bruker D8) analysis was conducted to study the crystal structure of our Si thin films.

Silicon electrodes deposited on copper foil were cycled in Li-ion coin cells (Hohsen 2032) vs. lithium metal counter electrodes. Cells were assembled in an argon-filled glovebox (<1 ppm O$_2$ and H$_2$O) using 1.2 M LiPF6 in 3:7 wt. % ethylene carbonate: ethyl methyl carbonate electrolyte and two Celgard 2325 separators per cell. The coin cells were cycled at room temperature between 10 mV and 1.5 V vs. lithium at 50 μA (40 μA/cm$^2$) on a MACCOR battery tester.

1.2 Results and Discussion

As described above, it is expected that density of conventional Si thin films produced by low-pressure magnetron sputtering should be close to the theoretical density value of bulk Si. In addition, according to SZM, films fabricated at higher working gas pressures should have a columnar structure with lower material density [48a]. Therefore, the density of the high-pressure Si thin films is expected to be lower than the theoretical value due to the shadowing effect discussed before. Table I summarizes the mass loading and density values of the Cr adhesion layer and Si thin films obtained by the QCM weight and cross-sectional SEM thickness measurements. Single layer silicon films deposited at low and high working gas pressures had densities of 2.33 g/cm$^3$ and 2.02 g/cm$^3$, which corresponds to 0% and 13% porosity. On the other hand, density modulated multilayer Si films had a density of about 2.22 g/cm$^3$ with a porosity value of about 5%, which reflects the average property of high and low density layers. These results agree well with the theoretical predictions of SZM [38a, 38b].

TABLE I

Thickness, density, porosity, and weight of the Si thin film samples obtained by quartz crystal microbalance (QCM) weight and cross-sectional scanning electron microscopy (SEM) thickness measurements. Film porosity has been calculated by comparing the measured film density to theoretical density of bulk Si (2.33 g cm$^{-3}$).

| Sample | Film thickness (nm) | Density (g cm$^{-3}$) | Film porosity (%) | Weight (mg) |
| --- | --- | --- | --- | --- |
| 1-layer low density | 74 | 2.02 | 13 | 18.98 |
| 1-layer high density | 98 | 2.33 | 0 | 28.87 |
| 2-layer density modulated | 190 | 2.21[a] | 5 | 53.10 |
| 4-layer density modulated | 390 | 2.21 | 5 | 106.20 |
| 6-layer density modulated | 450 | 2.24 | 4 | 127.62 |

[a]Density of 2-layer sample was calculated using the data from 4-layer sample.

Figure 3A:
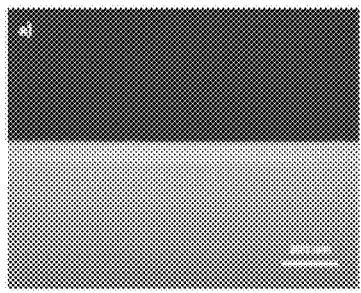
FIGS. 3a-3j show cross-section (left column) and top-view (right column) scanning electron microscopy (SEM) images of (FIGS. 3a and 3b) single layer low density, (FIGS. 3c and 3d) single layer high density, (FIGS. 3e and 3f) 2-layer density modulated, (FIGS. 3g and 3h) 4-layer density modulated, and (FIGS. 3i and 3j) 6-layer density modulated Si thin films deposited on Si substrates, according to embodiments of the invention.
Figure 3B:
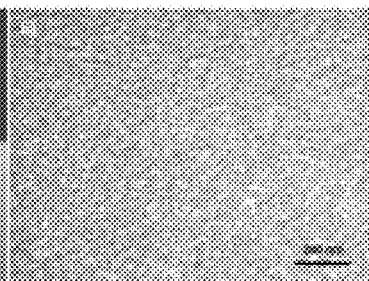
Figure 3C:
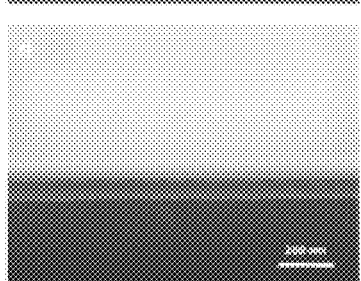
Figure 3D:
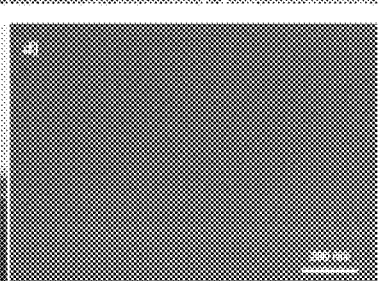
Figure 3E:
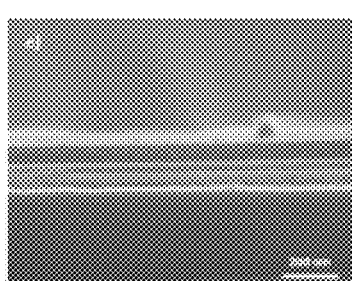
Figure 3F:
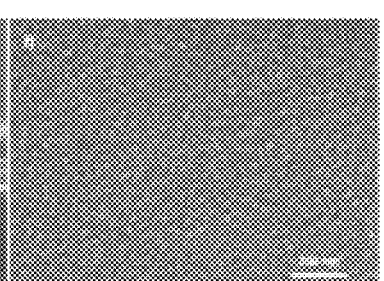
Figure 3G:
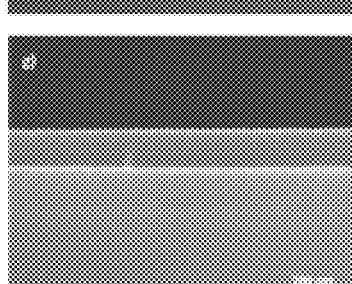
Figure 3H:
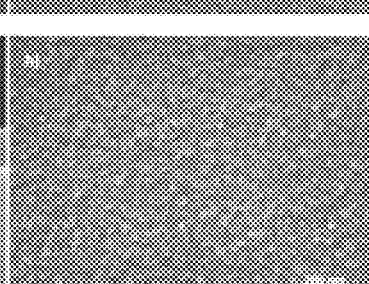
Figure 3I:
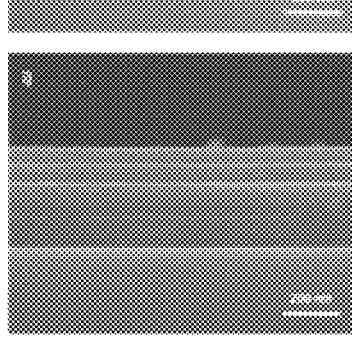
Figure 3J:
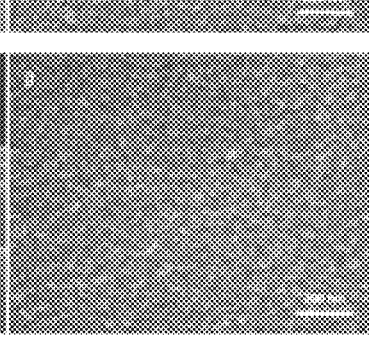

Cross-sectional and top-view SEM images of the Si thin films on Si wafers are shown in FIGS. 3a-3j. XRD results (not shown here) did not reveal any peaks indicating all of the films were amorphous. The layers of the density modulated multilayer samples can be distinguished from the cross-sectional images. During the deposition when going from high density to low density, the structure seems to be changing very gradually so it is harder to see the line between high density and low density. The 4-layer sample thus appears to only have 2 layers. However, when going from low density to high density, the transition is more drastic so that the line is more visible. During the deposition of the 2-layer sample, there were multiple pauses during the deposition of high-density layer because of the technical issues during deposition. It is believed that these pauses caused layers with the same density on top of each other. Therefore, the 2-layer sample is seen as if it had more than two layers. As mentioned earlier, more columnar and porous thin films are expected to develop during high-pressure sputter deposition according to the SZM. Cross-sectional SEM images (FIGS. 3a and 3c) show that low density layers of Si thin films look more porous compared to the conventional thin films. A rougher surface morphology is also anticipated in low density films due to the high porosity. The porous structure of low density film can be seen on the top-view SEM image (FIG. 3b), which is significantly rougher compared to the high density film (FIG. 3d). As all of the multilayer films ends with low density layers at the top, we can see the rough surface of the low density layer on top-view images of multilayer films (FIGS. 3f, 3h and 3j).

It is well known that adhesion stability of Si thin films on Cu foil is poorer with increased film thickness [17]. Si thin films can be partially or completely delaminated, or cracks can emerge due to the intrinsic stress of thin films [38a]. The preliminary experiments (not shown here) revealed that the delamination occurs with conventional Si films thicker than 150 nm on Cu substrates. In order to achieve better sticking property, a Cr adhesion layer was used in all of our samples sandwiched between the Cu foil substrate and Si films. Although the thickness of our 6-layer sample is almost half of a micrometer, no delamination was observed. This improvement can be attributed to a combination of compliant property of density modulated thin films [38a, 38b] and improved adhesion due to the Cr layer.

Figure 4A:
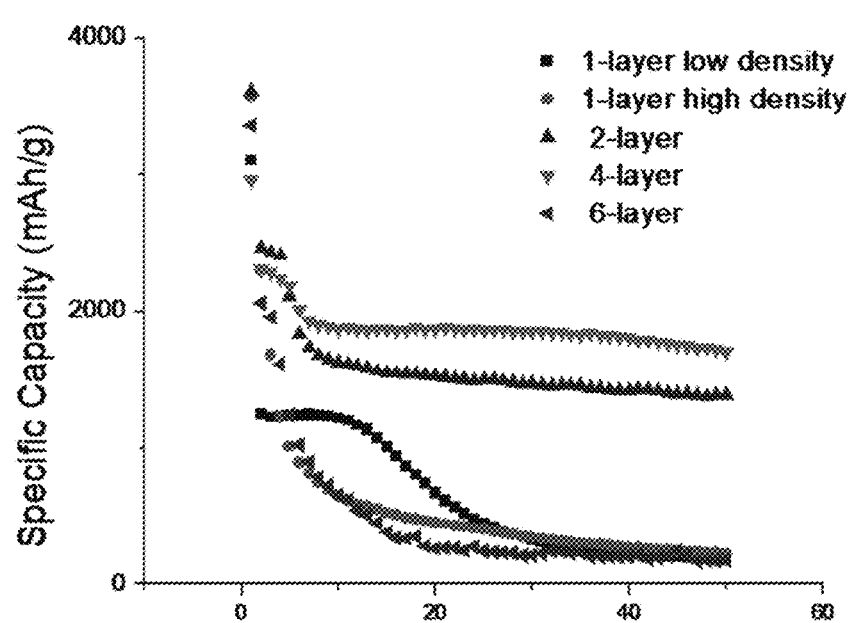
FIGS. 4a and 4b show discharging (FIG. 4a) and charging (FIG. 4b) profiles of conventional (1-layer samples) and density modulated (2, 4, and 6-layer samples) Si thin electrodes, according to embodiments of the invention.
Figure 4B:
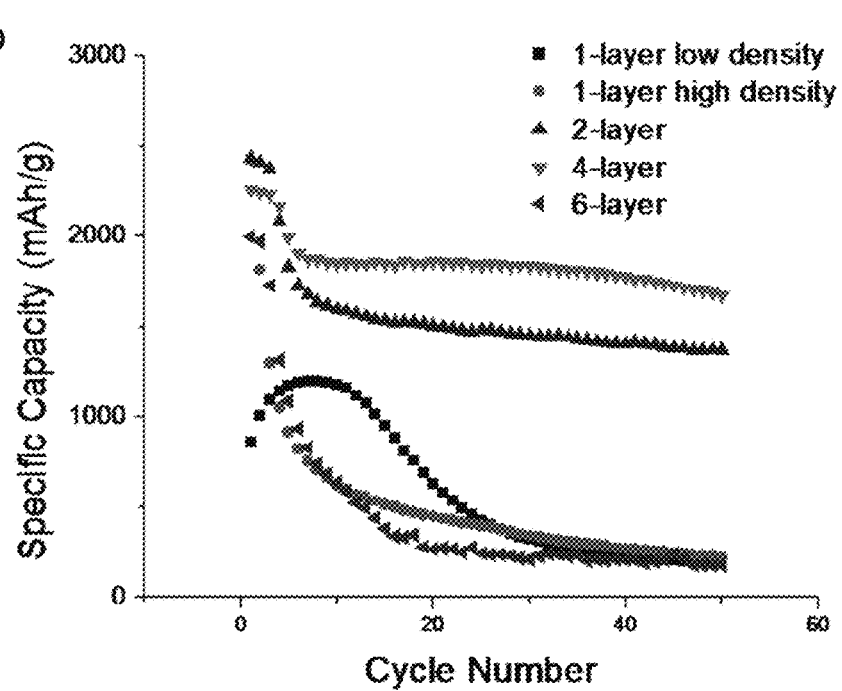

FIG. 4 shows the discharge (lithiation) and charge (delithiation) profiles of Si thin film electrodes analyzed for up to 50 cycles. All samples except the 1-layer low density film demonstrated high initial specific capacities approaching about 2500-3500 mAh/g (charging-discharging). High initial irreversible capacity values are attributed to solid electrolyte interphase (SEI) formation. Samples of 1-layer low density, 1-layer high density, and 6-layer density modulated Si had the poorest capacity retention amongst our samples, having $50^{th}$ cycle discharge specific capacity values of 185, 222 and 178 mAh/g, respectively. On the other hand, density modulated Si samples of 2-layer and 4-layer demonstrated much better performance with $50^{th}$ cycle specific capacities of 1392 and 1704 mAh/g, respectively, which are higher than most of the silicon anode results reported in the literature. It is also noted that high specific capacity results in previous studies on Si were obtained only after special substrate treatments, unlike the simple, low-cost, environment-friendly, and scalable density modulation process presented in this work. The low cycling performance of the 6-layer sample is believed to originate from higher intrinsic stress of this thicker film that is typically seen in sputter deposited films [38b]. This also indicates that thickness of the low density layers that act as compliant need to be optimized, which can further enhance cycling stability for density modulated films and will be the subject of a future study.

Figure 5:
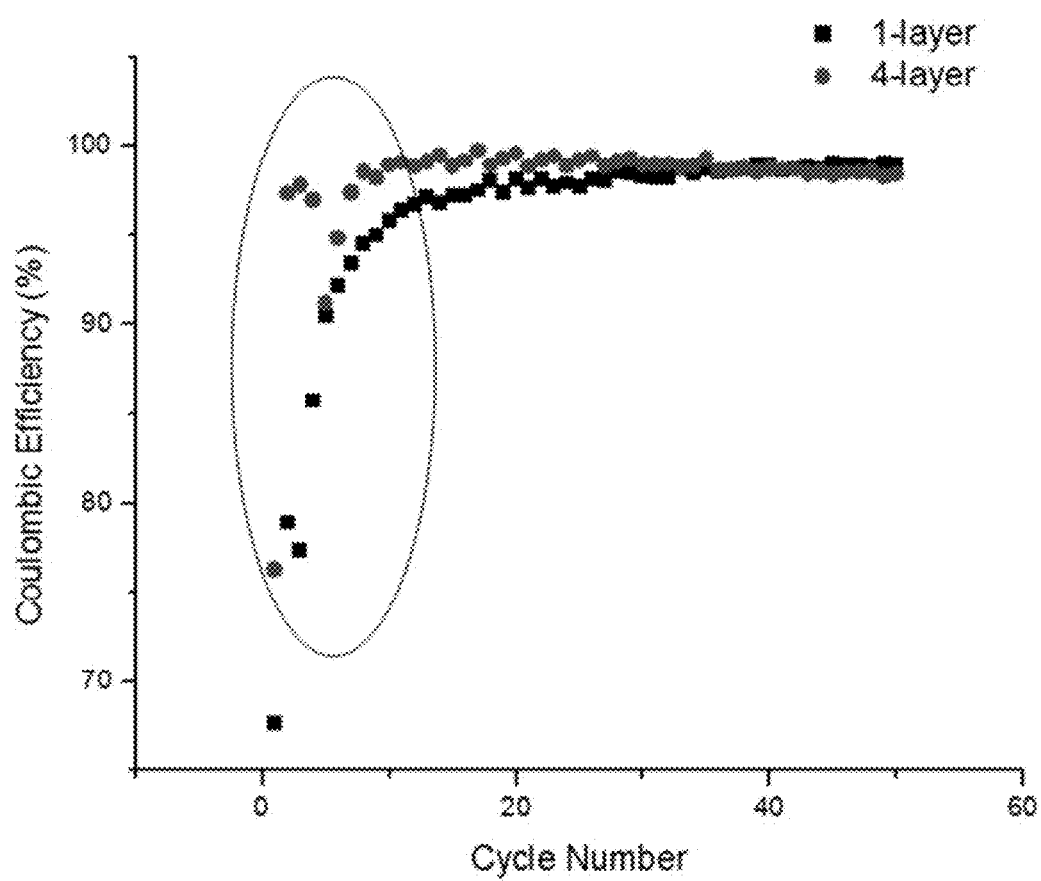
FIG. 5 shows coulombic efficiency of single layer high density and 4-layer density modulated Si electrodes, according to embodiments of the invention.
Figure 6A:
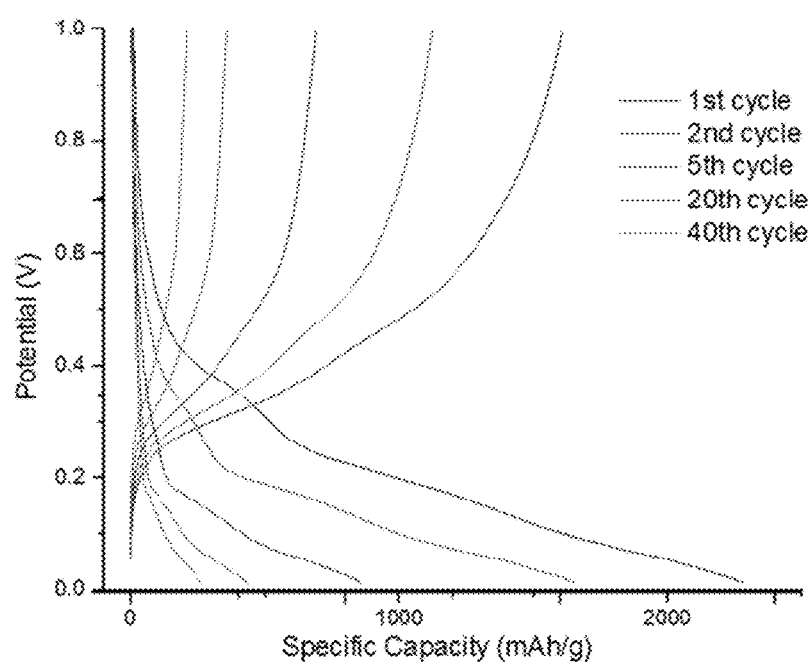
FIGS. 6a and 6b show voltage profiles of (FIG. 6a) single layer high density and (FIG. 6b) 4-layer samples for first 40 cycles, according to embodiments of the invention.
Figure 6B:
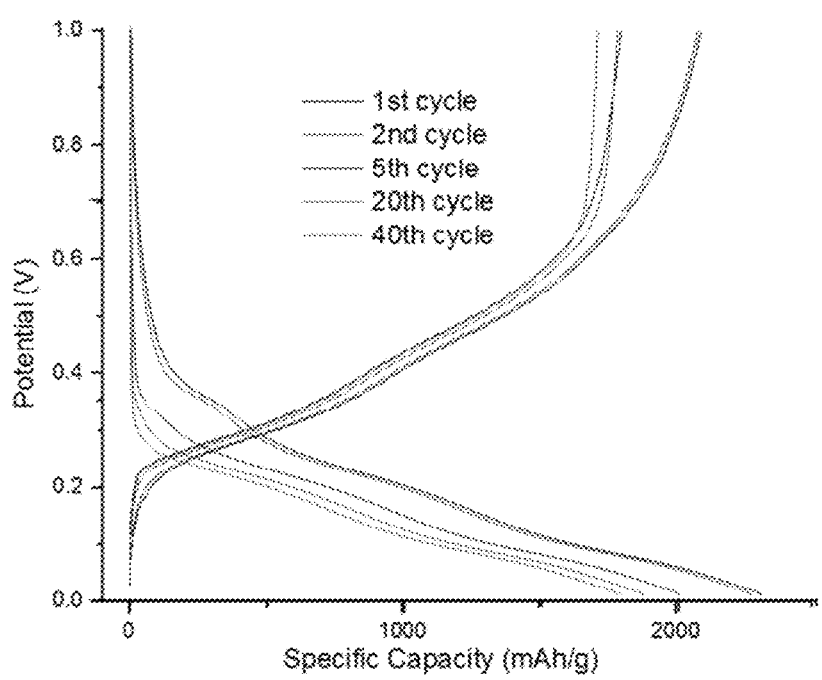

A more detailed investigation of the cycling performance and electrochemical properties of the highest capacity sample, the 4-layer Si, and the single layer high density Si as comparison is presented in FIGS. 5 and 6a-6b. FIG. 5 shows the Coulombic efficiency over 50 cycles for both samples, with the inset highlighting the first 10 cycles. The best performing sample of 4-layers had a 76% first cycle efficiency, which quickly recovered to >98% after 4 cycles. However, conventional high-density film experienced several low efficiency cycles before stabilizing at >98% after around $30^{th}$ cycle. Particles coming off the electrode or anode sections not being accessed due to the high density are probable contributors to poor coulombic efficiency. At the end of 50 cycles, the coulombic efficiency of both cells was >98%, which is attributed to good mechanical properties of the 4-layer Si film, and to only a low capacity of material being cycled on the single layer film.

Figure 7A:
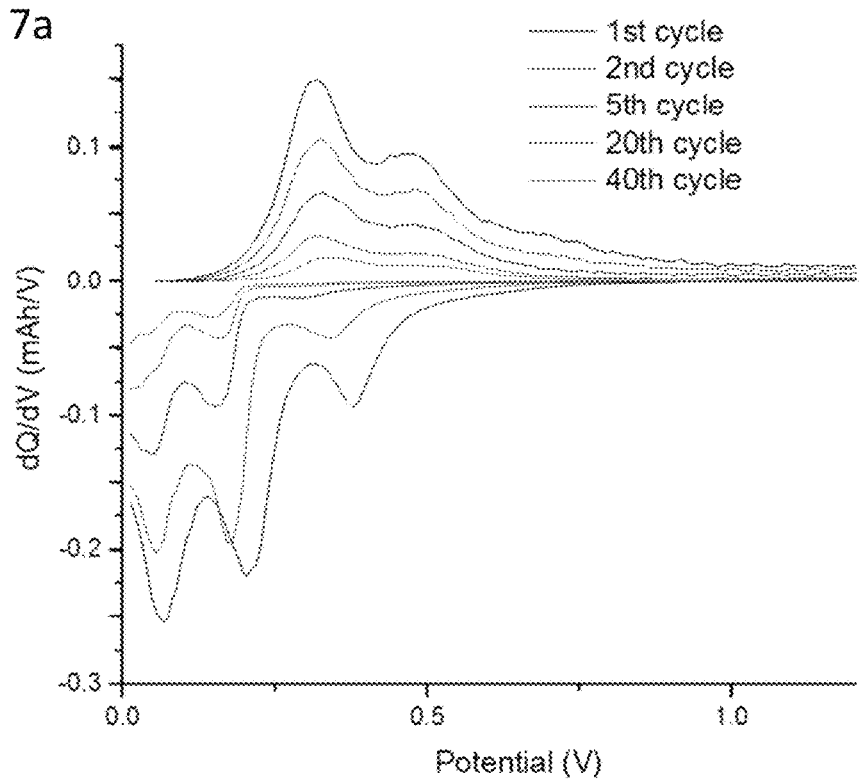
FIGS. 7a and 7b show dQ/dV curves of (FIG. 7a) single layer high density and (FIG. 7b) 4-layer samples for first 40 cycles, according to embodiments of the invention.
Figure 7B:
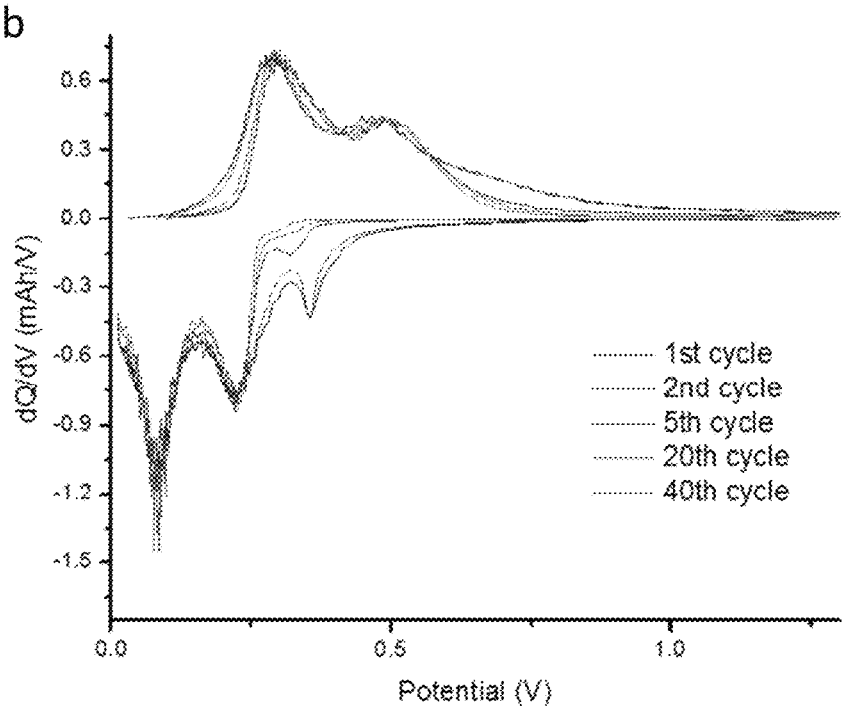

FIGS. 6a and 6b show the voltage and dQ/dV profiles of select cycles for the conventional single layer high density Si sample. The results are similar to those of the single layer low density and 6-layer samples (not shown). Plateau starting around 0.3 V during lithiation in FIG. 6a is considered to be a characteristic of Li—Si interaction. FIGS. 7a and 7b show the sample plots for the best electrode tested, the 4-layer density modulated film. Voltage profile and dQ/dV curve of the 4-layer is similar to the results of 2-layer sample (not shown here). In FIG. 7b, the anodic peak at about 0.4 V in the first 2 cycles can be attributed to the SEI layer formation, which later disappears in the $3^{rd}$ cycle. Anodic peaks at 0.05 V and 0.2 V; and cathodic peaks at about 0.3 V and 0.5 V are attributed to lithiation and delithiation of Si, respectively. As the intensity of the peaks decreases in single layer sample in each cycle, amount of reaction lowers down each cycle which indicates the loss of active material during cycling. In contrast, dQ/dV profiles of the 4-layer density modulated Si sample (and similarly also of the 2-layer film) ranging from $3^{rd}$ cycle up to the $40^{th}$ cycle overlap perfectly indicating that there is not any notable material loss from the electrode, which further shows the enhanced durability of density modulated Si anodes.

On the other hand, conventional Si thin film anodes reported in previous studies typically show poor stability especially when the film thickness is increased beyond several hundreds of nanometers where stable cycling fails immediately after few tens of cycles [12]. Researchers were able to increase stable critical Si film thickness only after special substrate treatments such as sanding and chemical etching, which can enhance the contact area and adhesion with the anode film [31c], while on the other hand makes the process more complicated, hazardous, and costly. For instance, Si thin films deposited on roughened Cu foils [44, 45] showed specific capacity values of 1200 mAh/g and 1500 mAh/g at the 30th cycle. On the other hand, density modulated Si films of this study, which were deposited on untreated current collectors through a much facile process, provided better cycling performance with higher specific capacity values (e.g., the 4-layer density modulated Si anode had a stable about 1700 mAh $g^{-1}$ capacity even after the $50^{th}$ cycle).

Figure 8A:
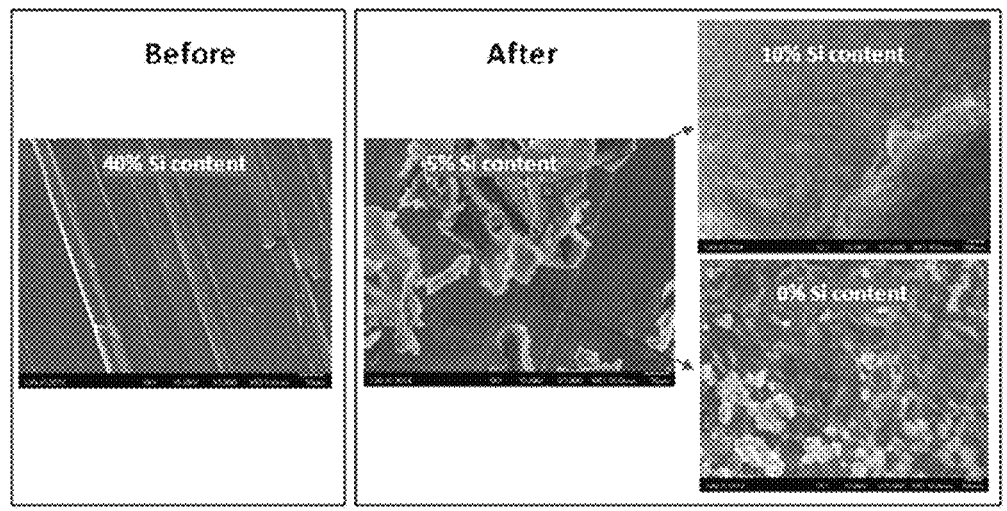
FIGS. 8a and 8b show EDS images of (FIG. 8a) 6-layer and (FIG. 8b) 4-layer samples after electrochemical characterization, according to embodiments of the invention
Figure 8B:
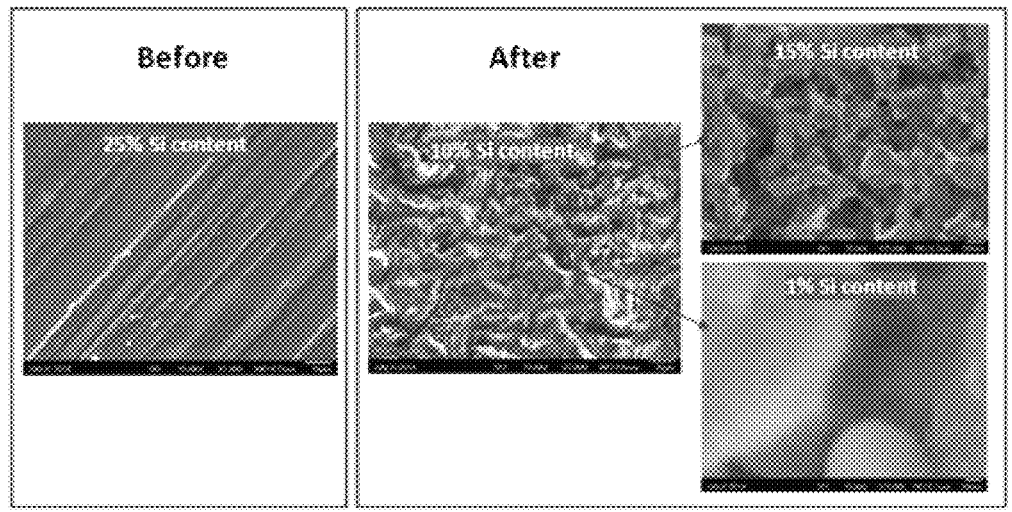
Figures 9A, 9B, 9C, 9D, 9E, 9F, 9G, 9H, 9I, 9J:
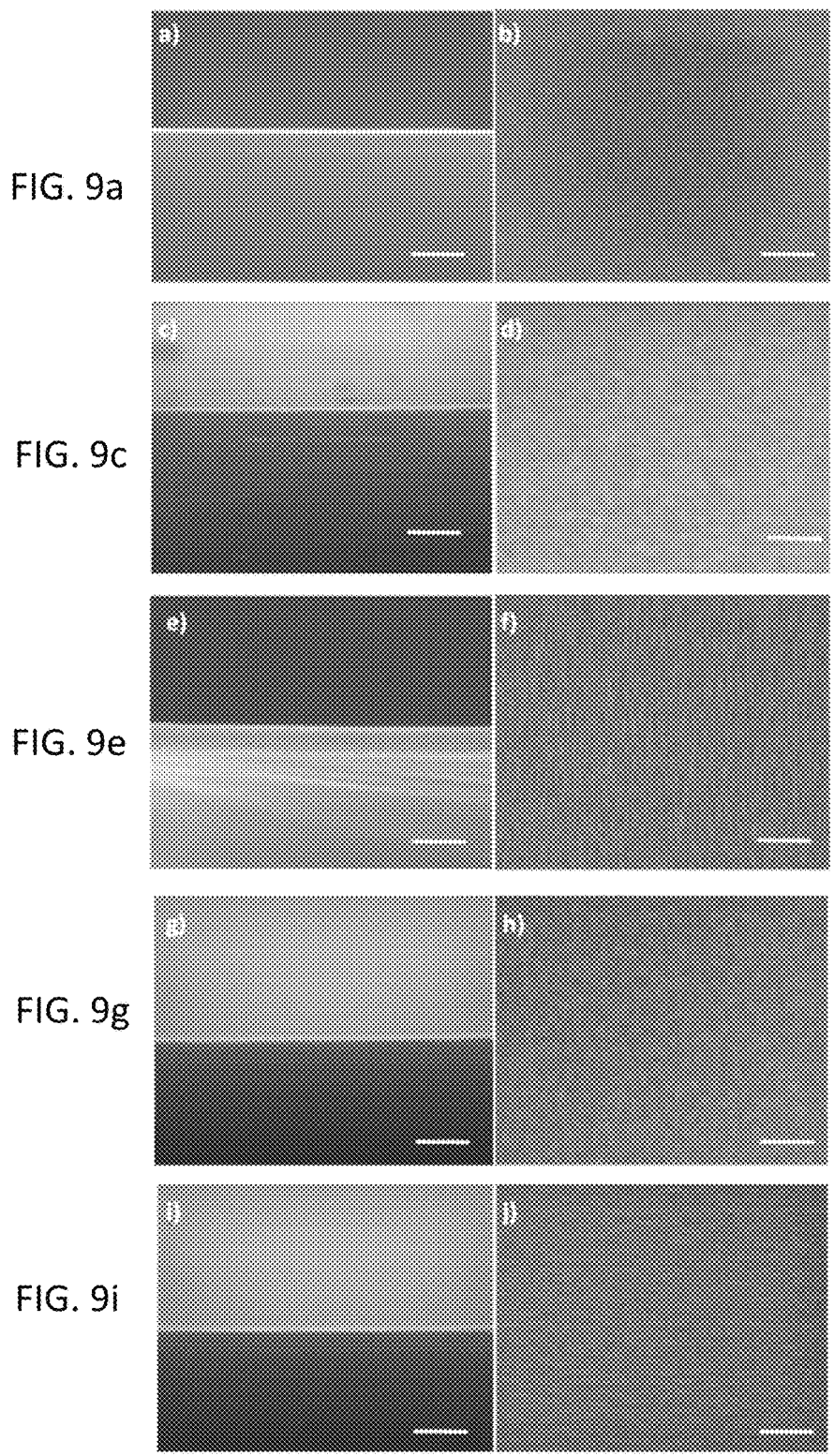
FIGS. 9a-9j show cross-section (left column) and top-view (right column) SEM images of Si thin samples sputter deposited at 2 (FIGS. 9a and 9b), 8 (FIGS. 9c and 9d), 14 (FIGS. 9e and 9f), 20 (FIGS. 9g and 9h) and $26 \times 10^{-3}$ mbar (FIGS. 9i and 9j) Ar pressures, according to embodiments of the invention. Scale bars are 200 nm.

SEM images including EDS weight percentages of Si on the electrodes before and after cycling are shown in FIGS. 8a and 8b for two of the electrode samples of 4-layer and 6-layer Si, which had high and poor cycling performance, respectively. Single layer and 6-layer thin films were observed to have pulverized/peeled off from the Cu surface after 50 cycles by visual inspection. SEM images and EDS results of FIG. 8a (6-layer sample) shows that these films almost completely came off the Cu current collector and with only some randomly agglomerated particles left over on the surface. EDS analysis show that Si is only found in these particles besides some other residual material from the electrolyte for the 6-layer sample (and similarly for the single layer films; not shown). This indicates that the conventional single layer and 6-layer films mostly delaminated from the substrate, and leftover Si was agglomerated with some residual materials forming cluster-like structures. EDS detects residual materials of F, O and Cr along with Si in those particles while there is only Cu (about 97%) and O (about 3%) in the empty spaces. On the other hand, according to FIG. 8b, films of 2-layer and 4-layer samples were mostly intact although some limited agglomeration was observed. The SEM micrographs in FIG. 8b show higher resolution images of some of the agglomerated particles. Images show randomly varied arrangement of crack-like separations. EDS results agree with electrochemical cycling results where the 4-layer sample gives the best durability and cycling results amongst our samples.

The main reason for failure of Si as an anode material in Li-ion batteries is the high volume expansion and stress change during lithiation/delithiation as explained earlier. The improvement in the cycling properties of our multilayer Si thin films can be understood in the view of a controlled crack propagation process. When a small crack is initiated in a standard Si thin film, it can move through the whole film until it reaches at the interface where delamination might occur (FIG. 1a). On the other hand, in our density modulated multilayer samples, the borders between each layer can be considered as a grain boundary. Cracking is expected to occur predominantly in high density layers due to their higher volumetric change during lithiation/lithiation, while the low density layers provide a compliant property [38c, 55] and better accommodate volume expansion/contraction due their higher porosity and surface/volume ratio. Therefore, crack propagation is likely to continue until it stops at the boundary with the neighboring low density layer (FIGS. 1b-1f). In other words, density modulation can allow confining the cracks at the high density layers before it causes complete pulverization or delamination of the film, which leads to enhanced toughness of the film. Even if any delamination occurs, it may happen locally or layer by layer thus enhance the stability and the lifetime of the thin film anode.

The high porosity of low density layers can potentially make the diffusion of Li ions into the electrode easier and provides porous pathways for fast Li alloying/de-alloying. On the other hand, denser films are expected to accommodate more Li ions (i.e., due to more Si atoms per film volume) and have better electronic conductivity, yet they are more susceptible to mechanical fragmentation, and lithium diffusion can be more difficult due to the denser structure. Therefore, using high and low density films together can combine their advantageous properties for an optimal Si thin film anode material. It is believed that using a doped Si source to produce electrically more conductive Si films have a notable contribution to the improved properties [31c].

1.3 Conclusion

We report that density modulated multilayer Si thin films incorporating alternating layers of low and high densities produced by a simple high/low pressure sputter deposition process can have the ability to bear the large volume changes and achieve superior cycling stability as anode materials for Li-ion batteries. Electrochemical battery tests done with density modulated Si thin film anodes show that these films can provide enhanced specific capacity and stability properties compared to conventional high density Si films and to those Si films prepared by more complicated, costly, and environmentally hazardous fabrication methods. A 4-layer density modulated sample was still able to hold a reversible capacity of about 1700 mAh/g at the 50th cycle with a high coulombic efficiency of about 99%. Enhanced cycling performance of density modulated Si anodes is believed to originate from their controlled microstructure which limits the crack propagation and increase the toughness of the film against huge volumetric changes during lithiation/delithiation.

Example 2

Low-Density Silicon Thin Films for Li-Ion Battery Anodes

Density of sputter deposited silicon thin films was changed by a simple working gas pressure control process, and its effects on the cycling performance of Si films in Li-ion batteries as anodes was investigated. Higher gas pressure results in reduced film densities due to a shadowing effect originating from lower mean free path of sputter atoms, which leads to a wider angular distribution of the incoming flux and formation of a porous film microstructure. Si thin film anodes of different densities ranging from 2.27 $g/cm^3$ (film porosity about 3%) down to 1.64 $g/cm^3$ (about 30% porosity) were fabricated by magnetron sputtering at argon pressures varying from $2\times10^{-3}$ mbar to $26\times10^{-3}$ mbar, respectively. High density Si thin film anodes of 2.27 $g/cm^3$ suffered from an unstable cycling behavior during charging/discharging depicted by a continuous reduction in specific down to about 830 mAh/g at the $100^{th}$ cycle. Electrochemical properties of lower density films with 1.99 $g/cm^3$ (about 15% porosity) and 1.77 $g/cm^3$ (about 24% porosity) got worse resulting in only about 100 mAh/g capacity at $100^{th}$ cycle. On the other hand, as the density of anode was further reduced down to about 1.64 $g/cm^3$ (about 30% porosity), cycling stability and capacity retention significantly improved resulting in specific capacity values about 650 mAh/g at $100^{th}$ cycle with coulombic efficiencies of >98%. Enhancement in our low density Si film anodes are believed to mainly originate from the availability of voids for volumetric expansion during lithiation and resulting compliant behavior that provides superior mechanical and electrochemical stability.

In EXAMPLE 1, a new density modulated multilayer Si thin film anode approach has been developed, which can provide a robust high capacity electrode approach for Li-ion batteries [23]. These films were able to provide a high coulombic efficiency up to 99% and reversible specific capacity as high as about 1700 mAh $g^{-1}$ after 50 cycles [56]. Low-density layers are believed to be performing as compliant layers during volume change making the films more durable compared to conventional Si film anodes. However, there has not been any attempt to understand the effect of the density of Si thin films on cycling performance. Therefore, the focus of this study is to compare the electrochemical characteristics of Si thin film anodes of different densities.

2.1 Experimental

Several Si thin films with different densities were fabricated at different deposition pressure values using an RF magnetron sputtering method. Target (i.e., source) to substrate distance was about 15 cm. Base pressure of the system was brought down to about $3\times10^{-6}$ mbar by a turbomolecular pump back by a mechanical pump. Ultra high purity argon (Ar) was used as the working gas for generating the plasma. As the deposition material source, 99.99% pure p-type Si target (Kurt-Lesker) with a diameter of about 5 cm was used. RF power was set to 200 W and substrates were rotated at 20 rpm during all depositions. Previous studies have shown that the adhesion strength of the thin films to the substrate is considerably effective on the electrochemical performance of Si film anodes [27, 30]. Therefore, we sputter deposited a thin chromium layer of about 25 nm on the substrates (99.99% pure Cr target with diameter: about 5 cm, RF Power: about 150 W, deposition time: about 2 mins) before each Si deposition to provide better sticking ability. Targets were cleaned by pre-sputtering for about 3 mins. Si thin films were deposited on circular copper (Cu) foil current collectors with the diameter of 1.27 cm and 15-25 μm thickness. Si films deposited on Si wafer pieces were used for imaging and crystal structure analysis purposes. Quartz crystal microbalance method (QCM) was used to measure the mass loading of the deposited films. Quartz substrates were placed on the substrate holder during depositions for this purpose. In this method, difference between the frequencies of QCM crystals before and after the deposition is used to calculate the mass of the films by using the Sauerbrey equation [67], as described in EXAMPLE 1. Details of the weight measurement were explained in our earlier work [56], as described in EXAMPLE 1. Depositions times were adjusted to produce Si films of similar weight about 25-26 μg on Cu foil substrates. Fabrication of each sample and density measurements were repeated about 5 times, and the average density values were taken for each sample of different densities, listed in Table II shown in FIG. 18.

As described in EXAMPLE 1, by controlling the gas pressure during sputter deposition, it is possible to fabricate high and low density films at low and high pressures, respectively. Therefore, in the study this simple and practical approach of changing working gas pressure was used in order to control the density of the sputter deposited Si film anodes. Deposition pressures for each sample are listed in Table II. Argon gas flow rate was adjusted between 10 and 15 sccm, and a gate valve was throttled to achieve a desired working pressure within $2 \times 10^{-3}$ mbar-$26 \times 10^{-3}$ mbar.

Electrochemical performance of the silicon films was tested by charging/discharging experiments in a two-electrode battery R&D coin cell set-up (Hohsen 2032). Cells were assembled in the argon-filled glovebox with a purity level of <1 ppm $O_2$ and $H_2O$. The lithium foil was used as the reference and the counter electrode in the coin cell. 1.2 M $LiPF_6$ in ethylene carbonate/ethyl methyl carbonate (EC/EMC) with the volume ratio of 3:7 was used as the electrolyte. The batteries were charged and discharged at constant current of 50 μA within a voltage window from 0.1 to 1.5 V (vs. Li/Li$^+$) at about ⅛ C rate.

2.2 Results and Discussion

Figure 10:
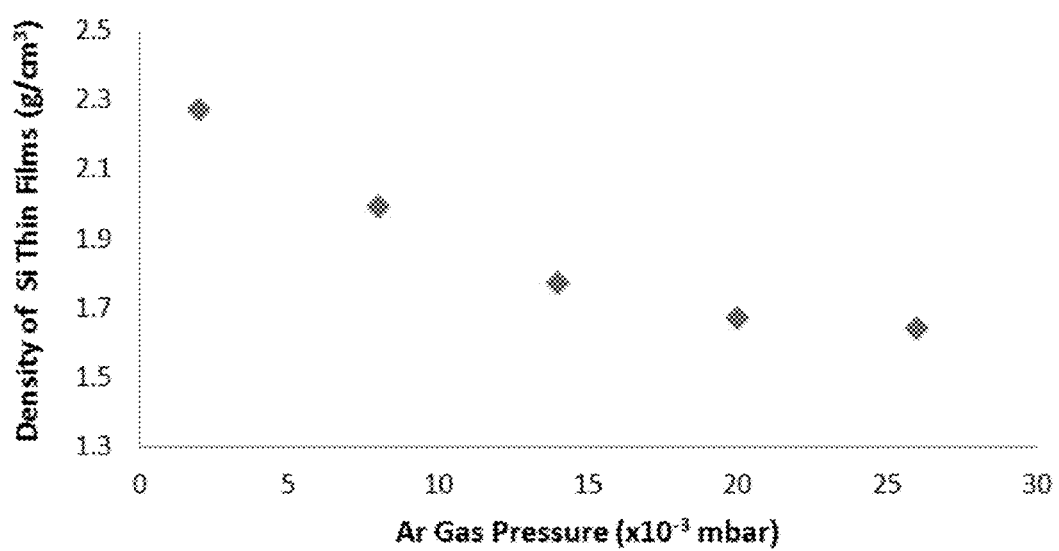
FIG. 10 shows density of Si films as a function of Ar gas pressure according to embodiments of the invention.

FIGS. 9a-9j show the top and cross-sectional SEM images of the Si films deposited at different Ar pressures. All the films produced did not show any X-ray diffraction peaks (not shown), indicating an amorphous structure. As the pressure is increased films get rougher and a columnar microstructure start to form, which is consistent with the well-known structure zone model (SZM) [48]. At higher working gas pressures, sputtered atoms go through an increased number of gas phase collisions that reduces their mean free path and increases the angular distribution of the incident flux on the substrate. For example, at the lowest and highest Ar gas pressures of $2.0 \times 10^{-3}$ mbar and $2.6 \times 10^{-2}$ mbar used in this study, mean free path of Si atoms as they pass through the Ar gas environment before they reach to the substrate are expected to be about 4 cm and about 3 mm, respectively [50, 51]. Therefore, given that the target-to-substrate distance in our experiments was about 15 cm, Si atoms can make a few or tens of collisions before they arrive at the substrate if the pressure is low or high, respectively. At high pressures, due to the wider angular distribution of the incident flux, atoms approaching at oblique angles lead to the "shadowing" effect that results in the formation of more columnar and porous films [55, 56, 38c]. In other words, by simply controlling the working gas pressure during sputtering, a variety of microstructures can be obtained ranging from smooth and dense films to rougher more porous coatings. In addition, Si films of similar weight loading gets thicker as the Ar pressure is increased (FIGS. 9a-9j), which indicates the reduction in films density. To confirm this, the film density was calculated as a function of Ar gas pressure using QCM mass loading and film thickness values (Table II), which are plotted in FIG. 10. As can be seen in FIG. 10, film density at the lowest Ar pressure of $2 \times 10^{-3}$ mbar is about 2.27 g/cm$^3$, which is close to the theoretical density of 2.33 g/cm$^3$ for amorphous Si films [35]. As the pressure is increased up to $8 \times 10^{-3}$ mbar, density of Si films drops down to about 1.99 g/cm$^3$ following a linear behavior, which corresponds to a film porosity of about 15%. At higher Ar pressures (FIG. 10), density of Si films further decreases down to about 1.64 g/cm$^3$ that corresponds to a about 30% porosity, as the pressure reaches $26 \times 10^{-3}$ mbar. As the cross-sectional SEM images (FIGS. 9a-9j) do not show any nano-pores, it is believed that most of the porosity originates from atomic scale voids that result from the shadowing effect of higher working gas pressures.

Figure 11A:
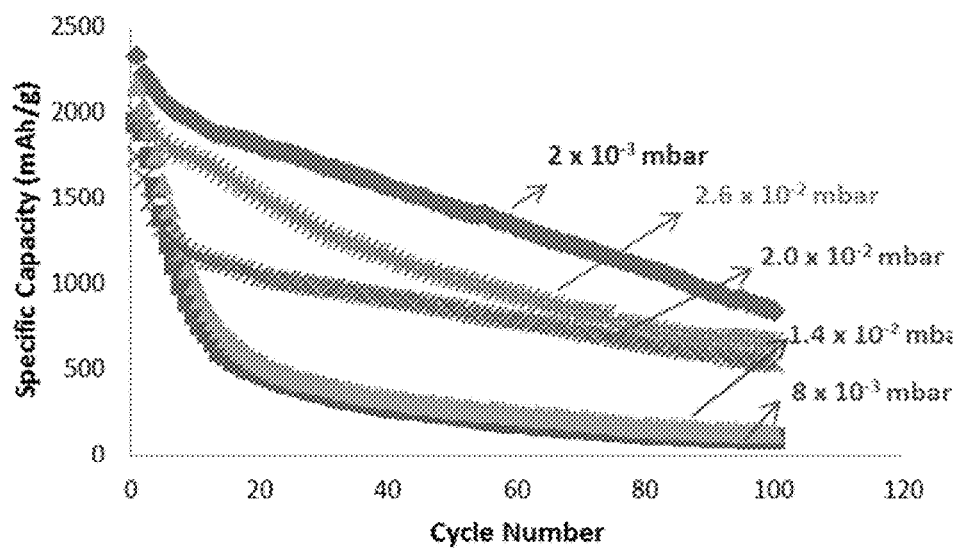
FIG. 11a shows cycling performance of Si thin films of different densities deposited at different Ar gas pressures.
Figure 11B:
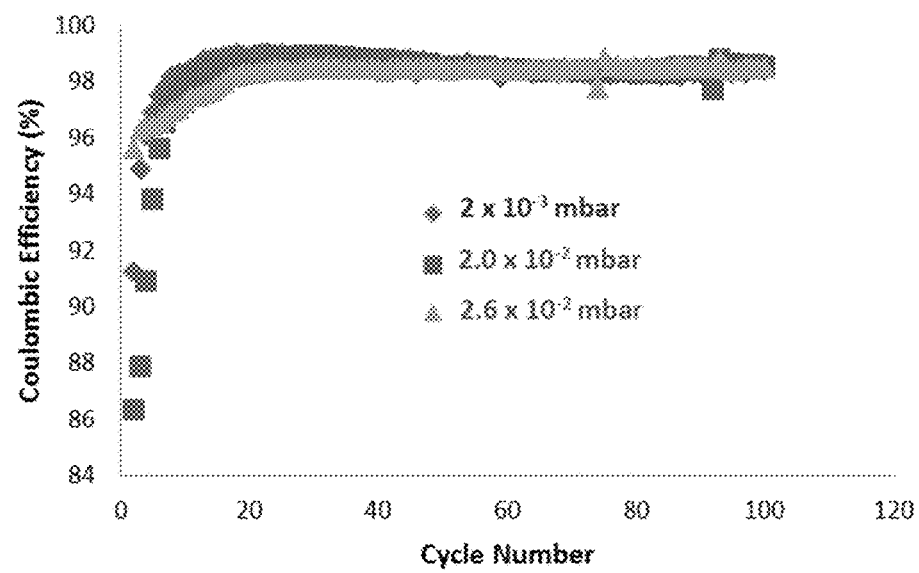
FIG. 11b shows Coulombic efficiencies of the samples fabricated at 2, 20 and $26 \times 10^{-3}$ mbar, according to embodiments of the invention.
Figure 12:
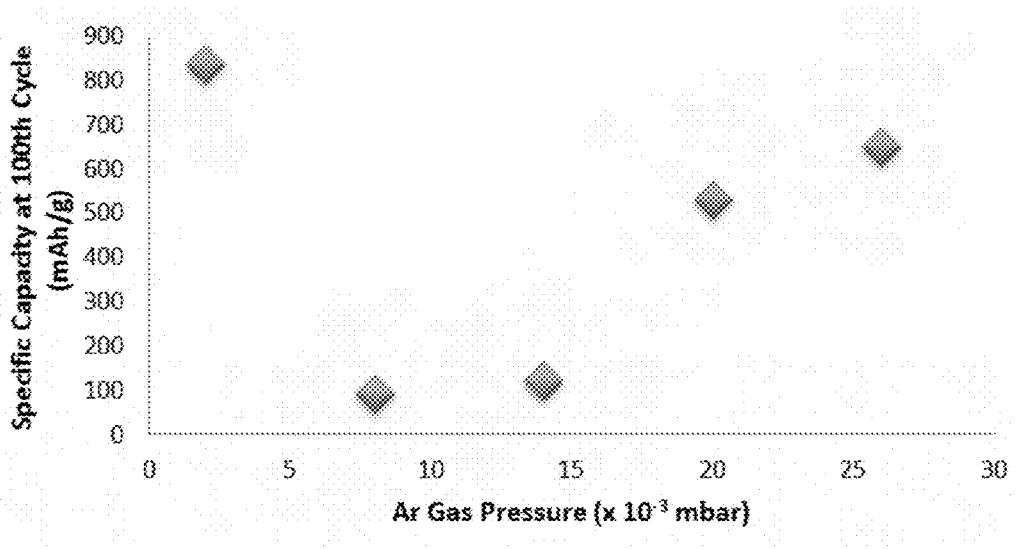
FIG. 12 shows $100^{th}$ cycle specific capacity values of Si films fabricated at different Ar gas pressures, according to embodiments of the invention.

Charging performance and coulombic efficiencies of Si films of different density in Li-ion battery tests are presented in FIGS. 11a and 11b. At initial cycles, all the samples show high specific capacity values ranging about 1,500-2,300 mAh/g (FIG. 11a). High density Si film (i.e., Ar pressure $2 \times 10^{-3}$ mbar) shows the highest specific capacity values starting from about 2320 mAh/g at the first cycle. However, its capacity value steadily decreases during the cycling tests down to about 830 mAh/g at 100$^{th}$ cycle, and it appears that it would continue to decrease beyond that. This behavior is consistent with earlier reports [12, 56] that attributes the poor cycling stability of conventional Si films mainly to its extremely high volumetric expansion/contraction approaching about 300-400% during lithiation/delithiation, which is followed by pulverization and detachment of Si fragments from the current collector. For Si films produced at relatively higher Ar pressures ($8 \times 10^{-3}$ mbar and $14 \times 10^{-3}$ mbar), cycling performance gets worse that is depicted by an abrupt decrease in specific capacity at initial cycles and stabilizing at a low capacity of about 100 mAh/g at 100$^{th}$ cycle (FIG. 11b). These films have porosity of about 15% and about 24% at $8 \times 10^{-3}$ mbar and $14 \times 10^{-3}$ mbar, respectively, as measured from QCM density values (FIG. 10). Poor cycling performance of these films are believed to originate from unstable solid electrolyte interface (SEI) layer formation coupled with the pulverization of the SEI layer during charging/discharging. Due to the porous microstructure and rougher morphology of these films (FIGS. 9a-9j), SEI layer can form at a larger interface and penetrate into the film. Volumetric changes during lithiation/delithiation can lead to the fragmentation and delamination of SEI layer that is followed by new SEI layer formation in the next cycle, which eventually leads to loss of active Si electrode material [50].

On the other hand, films of high Ar pressure deposited at $20 \times 10^{-3}$ mbar and $26 \times 10^{-3}$ mbar shows an improved cycling stability compared lower pressure films. As can be seen in FIG. 11a, their specific capacity values decrease at a lower overall rate and stabilizes after about 80$^{th}$-90$^{th}$ cycle at reasonable high capacity values of about 530 mAh/g and about 650 mAh/g for films of $20 \times 10^{-3}$ mbar and $26 \times 10^{-3}$ mbar Ar pressure, respectively. Coulombic efficiencies of the samples fabricated at 2, 20 and $26 \times 10^{-3}$ mbar, which show the best cycling performance among others, can be seen in FIG. 11b. After first 10-15 cycles, coulombic efficiencies of these samples become stable at the range of >98%. This interesting cycling performance improvement might be due to the sufficiently high porosity of these films that approaches about 28% for 20×10$^{-3}$ mbar and about 30% 26×10$^{-3}$ mbar Ar pressure (FIG. 10). Due to the more spacing available among Si atoms, volumetric expansion/contraction becomes easier to manage and reduces the pulverization of both the active Si and SEI layers. Similar enhancement has been previously reported for nanostructured Si anodes [12]. According to a revised SZM [48], it is possible to form sputtered films incorporating atomic or nano-size gaps/columns at growth conditions favoring low adatom mobility such as high working pressure presented in this study. Enhanced shadowing effect at high pressures can further promote formation of such gaps and lead to the formation of low-density films. Therefore, high working gas pressure method can present a much simpler and low-cost approach of producing stable Si thin film anodes for Li-ion batteries compared to the complicated and high cost synthesis techniques of nanostructured Si such Si wires [57] and rods [45].

2.3 Conclusion

In this work, we demonstrated a simple and low-cost method of producing low density silicon films as anodes for Li-ion batteries. We used high working gas pressures during sputter deposition of Si film that leads to the formation of voids due to the shadowing effect originating from obliquely incident atoms at high pressures. At high Ar pressures, density of our Si films reduced down to as low as about 1.64 g/cm$^3$ that corresponds to a porosity approaching about 30%. Such low density films showed an enhanced cycling stability that maintains specific capacity values of about 650 mAh/g after about 80$^{th}$-90$^{th}$ cycles with coulombic efficiencies of >98%. On the other hand, Si films with densities higher than about 1.7 g/cm$^3$ (i.e., porosity <about 25%) produced at lower Ar pressures showed poorer cycling performance that was indicated either by an abrupt decrease in specific capacity at initial cycles or a continuous steady decline without reaching stable capacity values even at large cycles. Inferior behavior of higher density Si films is consistent with the previously reported results for conventional Si anodes, which is believed to originate from high volumetric change during charging/discharging followed by unstable SEI layer formation and pulverization of active Si and SEI layer. However, such stability problems are avoided in our low density Si films due to the availability of voids for volumetric expansion that provides enhanced mechanical and electrochemical stability. Therefore, high pressure sputter deposition method can provide a simple, low-cost, and scalable approach of producing Si film anodes of superior cycling performance in Li-ion batteries.

Example 3

Residual Stress Modeling of Density Modulated Silicon Thin Films Using Finite Element Analysis As disclosed in EXAMPLES 1 and 2 above, density modulated thin films offer a compliant property that can reduce residual stress, which typically originate during the growth of thin films. Lower residual stress improves adhesion properties of the film with reduced buckling or delamination, and therefore leads to more durable coatings. In this study, finite element analysis (FEA) was employed to simulate the residual stresses developed in density modulated silicon (Si) thin films, which incorporate alternating low and high density layers. The main focus of this investigation is not developing new FEA algorithms but to verify the impact of density modulated layers quantitatively using computational methods. Hence, verification of a predicted stress reduction enhances the current understanding of the mechanics of density modulated layered thin films. FEA simulation results reveal that low density layers act compliant and result in significant reduction in film stress especially at the interface with the substrate. For example, maximum stress at the film/substrate interface, which is in the substrate, was reduced from 2897 MPa down to 2432 MPa by simply adding a 100 nm thick density-modulated low-density Si layer in between a 300 micron thick Si wafer substrate and 1 micron thick conventional high density Si film, which makes the reduction percentage of the maximum stress about 16%.

Basically there are two different types of stress that should be considered in thin film structures. These stresses could be categorized as fabrication stresses[15, 16] and operation stresses[17, 18]. In the second class, Si film anodes in Li-ion batteries also suffer from high volume expansion/compression during lithiation/delithiation, which introduces additional stress and can lead to cracking and pulverization of the whole film [58]. When combined with the stress due to lithiation/delithiation, residual stress in Si anode can elevate the crack formation and therefore pulverization can become even more pronounced for thicker films that typically have higher residual stress. It was reported that although residual stress can be minimized in silicon films of smaller thicknesses (<about 200 nm) [40], it can still trigger significant cracking during the lithiation/delithiation. Therefore, managing the residual stress in Si thin films may also lead to avoiding mechanical instabilities emerging during electrochemical cycling of Si anode. Lower intrinsic stress or enhanced resistance to it in Si thin films can reduce the risk of severe cracking and total delamination of the anode during charging/discharging. In this work, we will focus on the residual stress originating from the growth of Si thin films, and will investigate the stress due to lithiation/delithiation in another study.

Correlation between residual stress and film microstructure with various deposition process parameters has been systematically investigated by several research groups. It was shown that there is a strong relationship between Thornton's structure zone model (SZM) and residual stress for sputtered thin films [48, 59, 60]. It was recently demonstrated that low density thin films deposited at high working gas (e.g., argon) pressures and low temperatures have almost zero residual stress [38c]. However, these films show a columnar microstructure leading to poor electrical properties. Reduction in working gas pressures develops tensile stress. However further decrease in pressure causes a dramatic change from tensile to compressive stress as the film becomes denser. These types of films are recognized in SZM as belonging to Zone T [48c, 61]. The working gas pressure window for changing from tensile to compressive stress is too narrow; therefore, achieving low or zero stress films by simply adjusting the pressure has not been feasible. Karabacak et al. [38a, 38b] has shown that compressive stress of a thin film can be reduced by depositing relatively rough and low-density compliant layers between each standard high density layer. Therefore, by changing the deposition conditions, density modulated multilayer thin films including low and high density layers can be fabricated leading to reduced overall film stress. These low density layers, which have a packed columnar structure, were shown to act as compliant layers. These columnar layers are also believed to localize crack propagation due to their granular structure providing a large toughness [38a, 38b]. Therefore, micro-cracks induced by the stress in high density layers can be trapped within the multi-layers of the film. This could prevent the total delamination/buckling of the film from the substrate making it more durable. Furthermore, density modulated films can offer enhanced wear properties due to the potential layer-by-layer delamination instead of the total peeling of the film from the substrate. All these properties can provide the fabrication of durable coatings that are resistant to stress, wear, and delamination/buckling. Moreover, similar compliant property can also help reducing film failure during volume expansion/contraction of Li-ion battery silicon anodes as it is charged/discharged. As lithium ions insert into Si it can cause a compressive stress followed by cracking in the film. Low density compliant layers in density modulated Si anodes can limit the propagation of such cracks due to the similar mechanism explained above.

Critical thickness [40], where cracking starts to occur in Si thin films can be calculated using Griffith's [41] energy criteria. According to the Griffith's criteria, if the surface energy of the cracked Si is lower than the strain energy of the thin film, cracking becomes possible. The critical maximum film thickness ($h_c$) without cracks depends on Possion's ratio (y), cracking resistance force (GO, Young's modulus (F), and stress ($\sigma$) of the film as following [40]:

$$h_c \approx 4\sqrt{2} \frac{G_c E}{\sigma^2 (1-\gamma^2)} \qquad (3)$$

Therefore, one needs to take into account the effects of the mechanical parameters in Equation (3) in order to make stable Si thin films with thicknesses larger than a certain value. Reducing the overall stress of the film originating from growth (residual) or during lithiation/delithiation could significantly increase the critical film thickness. Another way of obtaining more stable thicker films can be through the increase in cracking resistance force.

In this work, we present a theoretical modeling study on a novel way of reducing the film stress using low density compliant layers and increasing film's resistance to mechanical fragmentation [55], which can lead to the fabrication of thicker and more stable Si film anodes. The main focus of this study is to investigate the mechanics of Si thin films in the presence of such a low density Si layer and determine the dependence of maximum stress on parameters including thicknesses of high density film, low density film (compliant layer), and Young's Modulus value of the low density layer.

3.1 Modelling

Finite Element Analysis (FEA) has been employed to perform the stress analysis in thin films in the literature [62-64]. FEA is a powerful numerical modeling tool that can simulate stress and deformation in wide range of materials of various shapes. Analytical modeling is quite challenging for these films of non-uniform microstructure. Therefore FEA becomes convenient as it can numerically solve mechanical equations for complicated geometries.

FEA includes three main steps including preprocessing, analysis, and postprocessing. The analysis step constructs and solves a system of linear or nonlinear algebraic equations using $$F_i = k_{ij} x_j \qquad (4)$$

Where 'F' and 'x' are externally applied force and nodal displacement respectively; 'k' is the stiffness matrix as a function of material behavior and model geometry. FEA codes solve Equation (4) and calculate the nodal displacements [65].

Modeling work has been reported yet on predicting the stress reduction in density modulated thin films. Previous studies were mainly experimental demonstrations of compliant property and enhanced mechanical durability of the density modulated thin films [59, 60]. Therefore, the results obtained in this study will enhance the knowledge regarding to the stress and failure mechanisms of density modulated thin film layered structures.

Figure 13A:
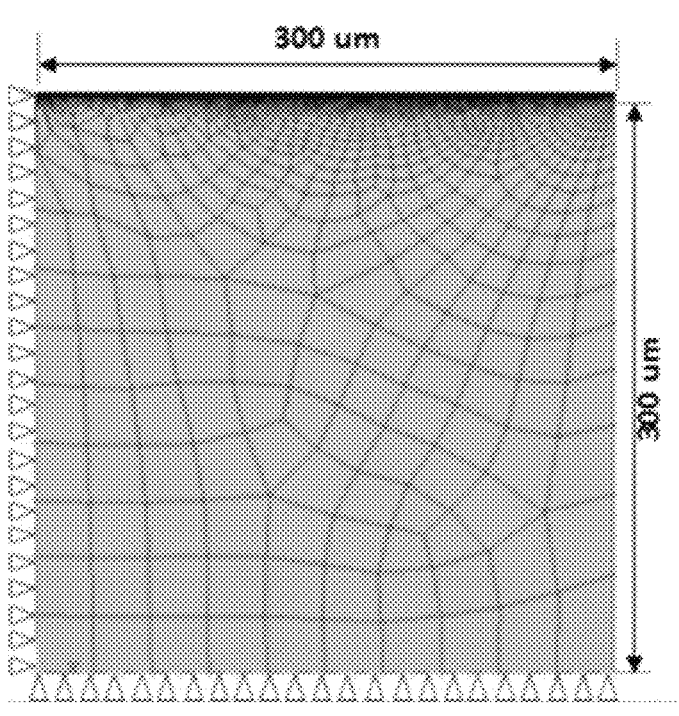
FIG. 13a. shows the dimensions, boundary conditions and the typical FEA mesh of the substrate.
Figure 13B:
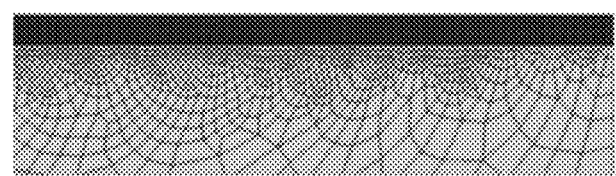
FIG. 13b shows a zoomed-in mesh.
Figure 13C:
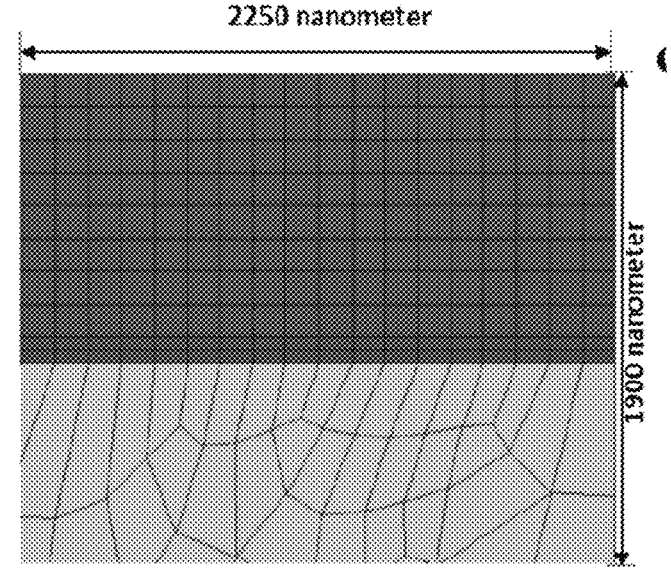
FIG. 13c shows a zoomed-in mesh, according to embodiments of the invention.

The materials simulated in all of the computations performed in this study are silicon and amorphous silicon, which are brittle materials. Therefore, in the FEA modeling of residual stresses in density modulated thin films, any kind of plastic deformation is neglected. The FEA mesh, boundary conditions on the models and the dimensions of the substrate are shown in FIG. 13a. FIGS. 13b and 13c show the zoomed-in mesh of the thin layer on the substrate. The commercial FEA software package ANSYS was employed in all of the numerical calculations in this study. Each Silicon film is assumed to be deposited on Silicon wafer substrate. There are two different structures considered in this study. The two-layer structure includes the crystal silicon substrate and the amorphous-Si film layer, while the three-layer structure has the low-density thin layer between the substrate and the amorphous-Si film layer. Even though there are two different structures considered in this study, there are four different model sets developed and modeled as summarized in Table III shown in FIG. 19. As a baseline case, film amorphous layer deposition on the Silicon substrate had been simulated, and then we started 3-layer analyses by embedding the low density modulated layer in between the high density film layer and the Silicon substrate in order to reduce the maximum tensile stress in the substrate. The thicknesses of the low density as well as high density film layers and Young's Modulus of the low density thin films were the parameters simulated and the impact on the maximum stress is quantified in the computational results.

The Young's Modulus E of the crystalline Silicon, which is considered as Si substrate under the Si thin films, is 180 GPa and the Poisson's Ratio (PR) is 0.26 in [66]. There is no data available in the literature for the low density amorphous Si thin films. However, it can be assumed that the E of the Si thin films changes approximately linearly with the density of film [38b]. Therefore, the E of the high density amorphous Silicon is considered and modeled to be 90 GPa, while 45 GPa was assumed for the low density thin film E, and both high-density and low-density amorphous Silicon were simulated using 0.26 as the PR.

The intrinsic loading applied in the calculations was simulated by thermal expansion in the thin film layer. The main goal of this study was quantitatively characterizing the impact of the density modulated layer. A reasonable strain loading was selected for a comparative analysis. The loading could have been any arbitrary number as long as the physics of the problem is simulated thoroughly. Therefore, 3% strain was assumed in the thermal loading.

Applying thermal loading is a methodology, which is adapted in this study to simulate the intrinsic stresses in a thin film structure. In other words, the modeling approach does not consider heat transfer or changes in the heating related physical or chemical properties such as melting, crystallization, or thermal stress. Therefore, in this study, we focus on the stress values generated as a result of thermal loading and treat it as the residual stress introduced during thin film deposition. Thermal loading manifests itself as body loading; therefore, applying thermal strain as body loading would appropriately simulate the residual strain in thin film layer structure. The modeling technique is dependent on the multiplication of 'Coefficient of Thermal Expansion (CTE)' and 'Temperature Difference'. Individual 'CTE' and 'Temperature Difference' values could be any combination but the multiplication of these two parameters should be 3% strain, as we assumed as the residual intrinsic strain after fabrication, in order to obtain comparative results. Since we present a comparative study, any strain value could be chosen. However, 3% was selected based on the strain values reported in [62]. In order to introduce such stress in the film, its temperature was increased by 5812 degrees uniformly across the film layer with a CTE of 5.2e-6, resulting in strain loading 5812×5.2e-6=0.03 (3%). Furthermore, the same 3% thermal strain loading could have been simulated with a CTE of 0.03 and by increasing the uniform temperature by one degree only, which would suffice to obtain 3% thermal strain loading. As long as the product of CTE and the temperature difference is kept at 3%, any kind of combination of CTE and temperature change could be employed to simulate 3% mechanical strain in the computations to characterize the mechanical response of the thin film in a layered structure.

While 3% strain loading was applied in the film layer as a body loading, on the other hand, the temperature of the substrate was kept the same, which mimics a zero-stress substrate. Therefore, the substrate constrains a thin film with residual stress through the interface between the film and substrate. While the thin film is trying to expand due to the applied strain loading, thin film is moving into compression and the substrate experiences the tension simultaneously. In other words, the applied strain results in compressive stress in the film and tensile stress in the substrate.

3.2 Results and Discussion

There are four sets of analyses performed in this study (see Table III). The maximum stress results obtained from the numerical computations are summarized in Table IV. The main focus was on determining the effect of the density modulated thin film layer on the maximum stress that is introduced on the substrate. Therefore, the results obtained from the first set of analyses establish the baseline values. Set-2 and set-3 provided basic information on the impact of the density modulated layer, and also the effect of varying thickness in both low density and high density layers. Set-4 results point out the sensitivity on Young's Modulus value of the low density thin film layer, which is given as a percentage of the E of high density thin film layer.

Figure 14A:
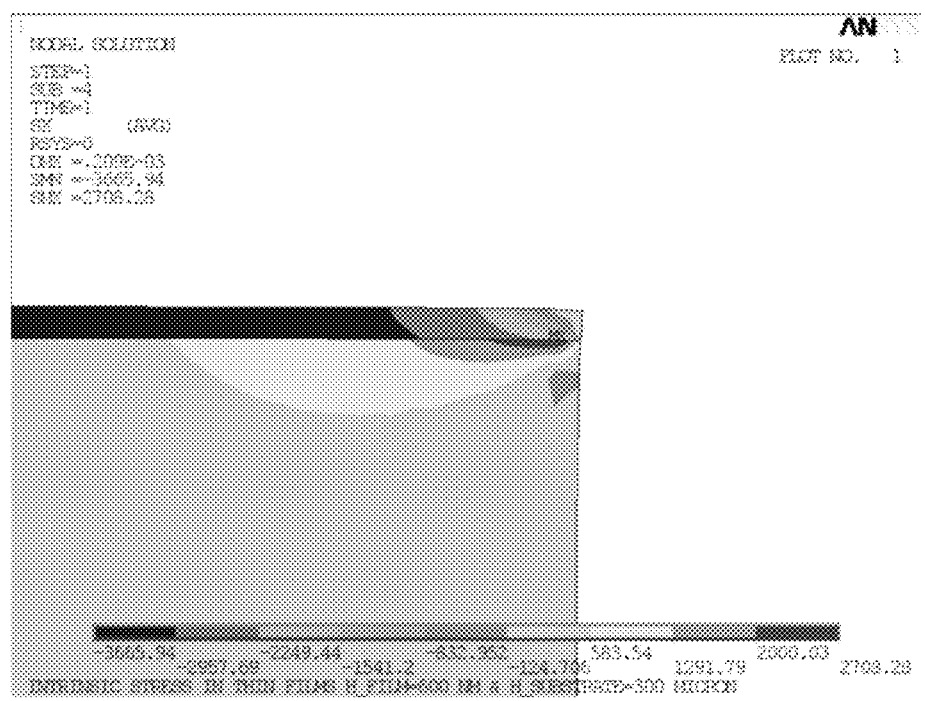
FIG. 14a shows a stress contour plot for film thickness of 600 nanometers and substrate thickness of 300 microns.
Figure 14B:
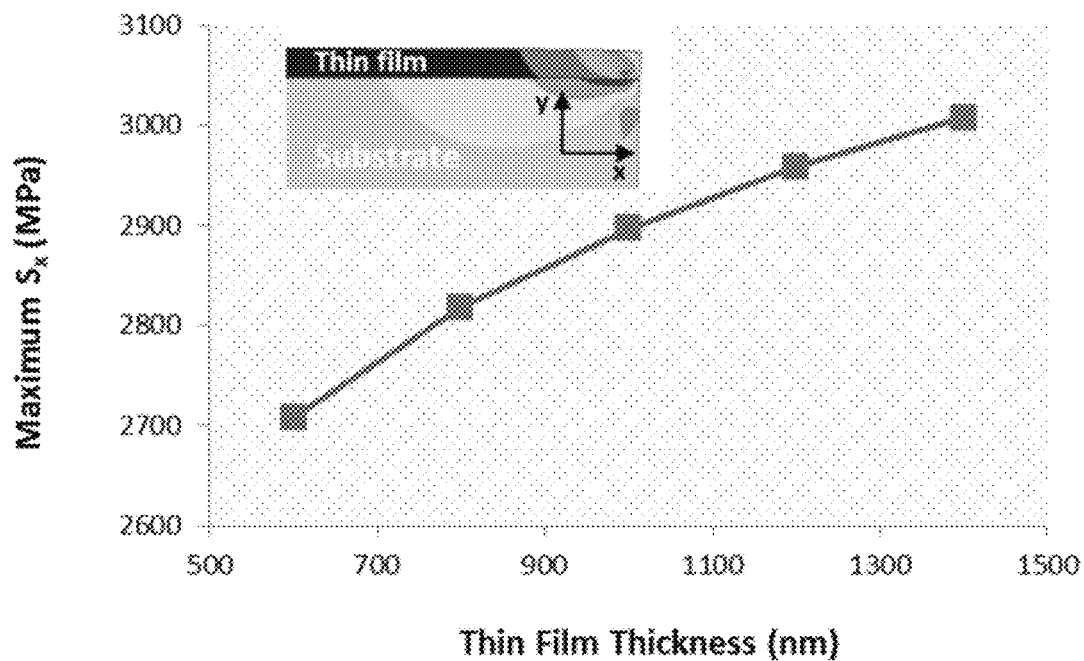
FIG. 14b shows a maximum tensile residual stress in the substrate for varying thin film thicknesses including 600, 800, 1000, 1200 and 1400 nanometers, according to embodiments of the invention.
Figure 15A:
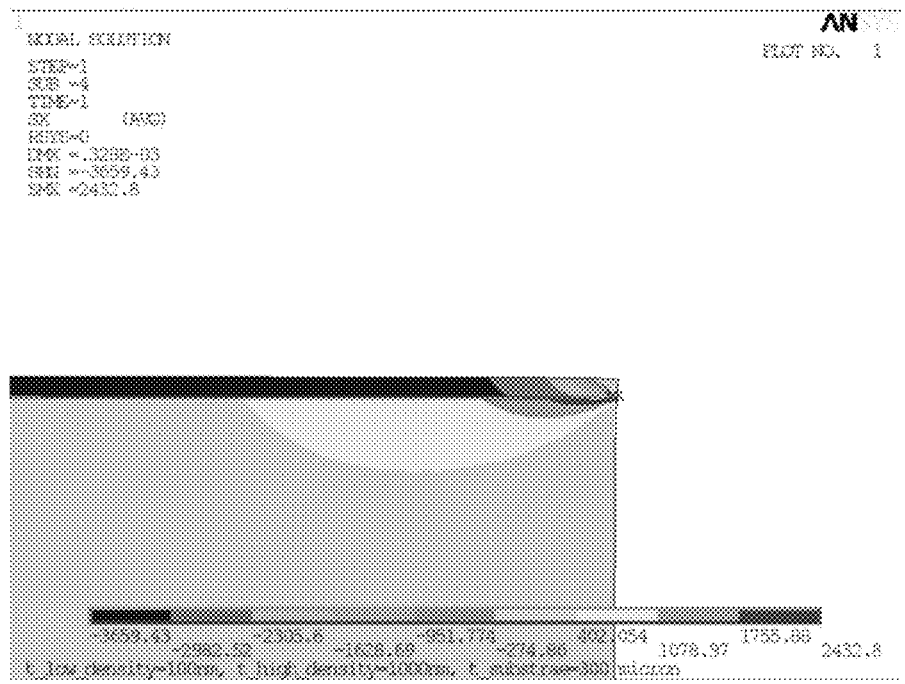
FIG. 15a shows a stress contour plot for low density film thickness of 100 nanometers, high-density film thickness of 1000 nanometers and substrate thickness of 300 microns.
Figure 15B:
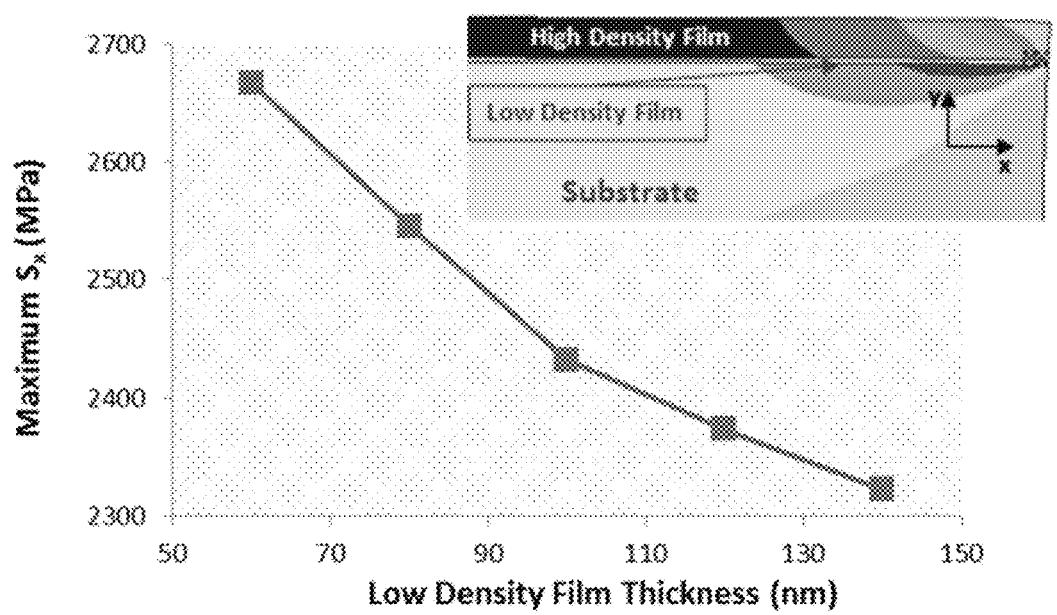
FIG. 15b shows a maximum tensile residual stress in the substrate for varying low density thin film thicknesses including 60, 80, 100, 120 and 140 nanometers, according to embodiments of the invention.

The thin film layer thickness was increased gradually to determine the stress variations in the structure in the first set of analyses performed in this study. FIG. 14a shows the stress contours in one of the five models developed in this set. The maximum tensile stress is obtained for the substrate in the vicinity of the thin film-substrate interface. The thin film experiences compression while it is pushing the substrate out through the interface. If there was no substrate, the thin film would expand uniformly without any intrinsic stress. Therefore, the residual stresses in the structure are due to the mechanical constraint applied on the thin film by the substrate. The maximum tensile stress calculated in the substrate is 2708 MPa for 3% applied strain loading. This maximum computed value is a relative number per the applied loading, e.g., if the applied loading is reduced by 50%, the maximum stress will reduce by the same magnitude as 50%. In all of the five models analyzed in the first set, they have the same 3% strain loading. The maximum stresses shown in FIG. 14b were obtained by varying film thickness values including 600, 800, 1000, 1200 and 1400 nm. The models simulated in FIGS. 15a and 15b have the same high density film layer thickness as Model 1(c) (see Table IV), which is 1000 nm high density film layer thickness. The stress contours plotted in FIG. 3(a) are obtained from Model 2(c) and have a maximum stress of 2432 MPa. Model 2(c) should be compared to Model 1(c) in order to understand and quantify the impact of low-density modulated film layers in the assembly. The maximum stress in Model 1(c) is 2897 MPa, which doesn't have a compliant layer. Density modulated compliant thin film layer results of stresses ranging from 2322 to 2667 for thickness values varying from 140 nm to 60 nm respectively are shown in FIG. 3(b). If the maximum stresses determined in Model 1(c) and Model 2(c) are compared, there is 16.1% stress reduction due to a 100 nm modulated thin film layer in between the substrate and the high-density film layer. The computed values will be smaller with lower strain values. They are directly proportional to the applied strain, i.e., if 0.3% strain was assumed as the loading, then the numbers would have been 289.7 and 243.2 but still giving 16.1% reduction in maximum stress.

TABLE IV

Summary of stress results obtained in the FEA computations.

| Set 1 Models | Thin Film Thickness (nm) | Maximum SX (Mpa) | Set 2 Models | Low Density Film Thickness (nm) | Maximum SX (Mpa) |
|---|---|---|---|---|---|
| m1a | 600 | 2708 | m2a | 60 | 2667 |
| m1b | 800 | 2818 | m2b | 80 | 2546 |
| m1c | 1000 | 2897 | m2c | 100 | 2432 |
| m1d | 1200 | 2959 | m2d | 120 | 2373 |
| m1e | 1400 | 3008 | m2e | 140 | 2322 |

| Set 3 Models | High Density Film Thickness (nm) | Maximum SX (Mpa) | Set 4 Models | Ratio of E Values of Low and High Density Layers | Maximum SX (Mpa) |
|---|---|---|---|---|---|
| m3a | 800 | 2349 | m4a | 0.05 | 2028 |
| m3b | 900 | 2394 | m4b | 0.1 | 2254 |
| m3c | 1000 | 2433 | m4c | 0.2 | 2390 |
| m3d | 1100 | 2467 | m4d | 0.3 | 2430 |
| m3e | 1200 | 2503 | m4e | 0.4 | 2440 |

Figure 16A:
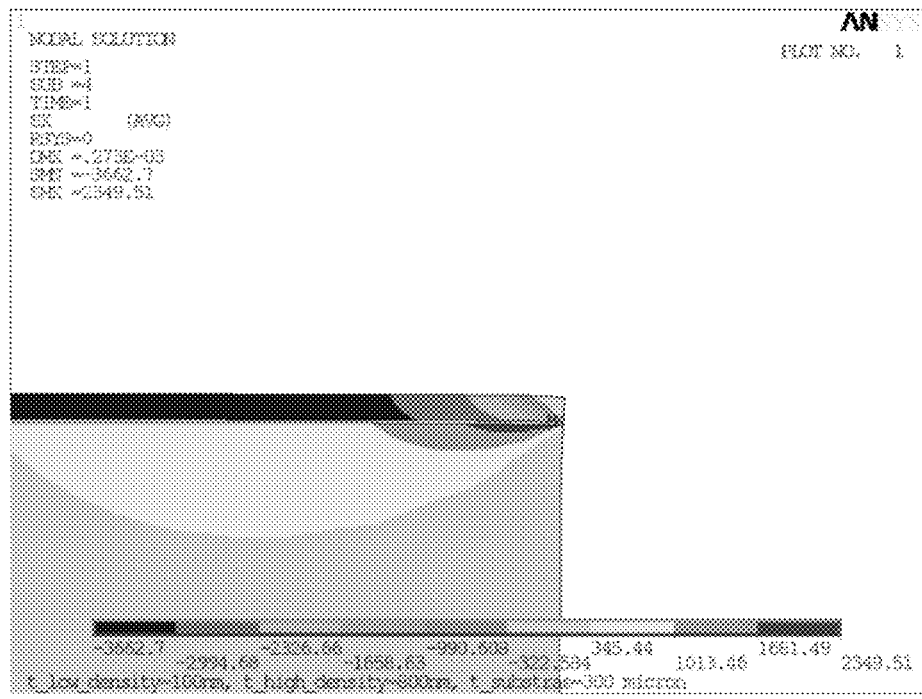
FIG. 16a shows a stress contour plot is shown for low density film thickness of 100 nanometers, high density film thickness of 800 nanometers and substrate thickness of 300 microns.
Figure 16B:
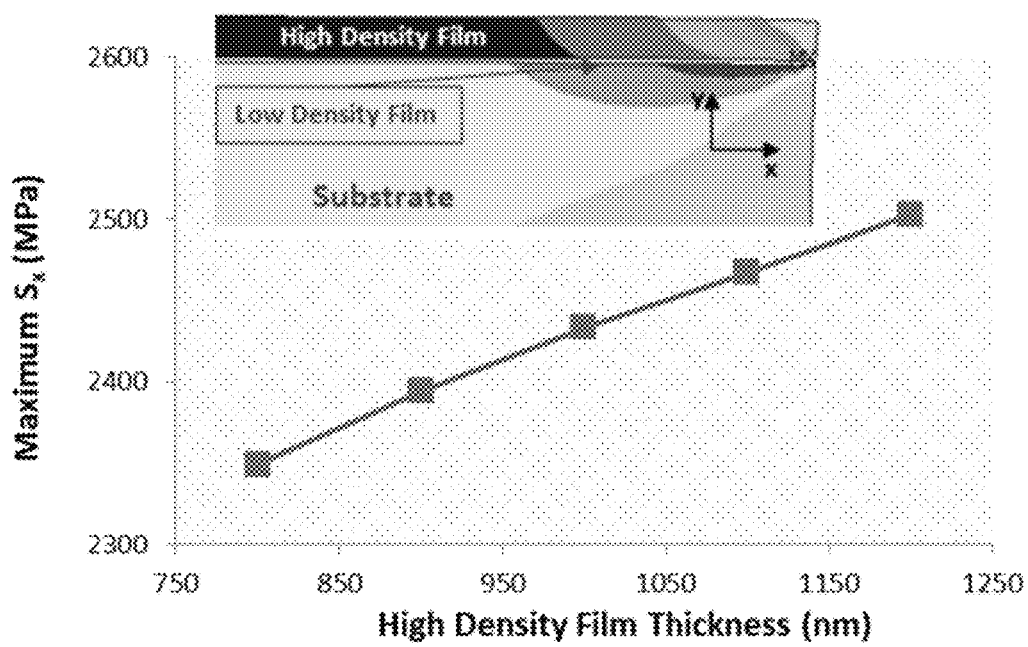
FIG. 16b shows a maximum tensile residual stress in the substrate is plotted for varying high density thin film thicknesses including 800, 900, 1000, 1100 and 1200 nanometers, according to embodiments of the invention.

The thickness of the high-density film layer was considered as the varying parameter in set-4 analyses. The maximum stress of 2349 MPa was obtained in Model 3(a) as shown in the contour plot on FIG. 16a. The maximum stress results increase linearly as shown in FIG. 16b as the thickness of the high density film increases over a 100 nm thin layer of low-density thin film layer. All of the computed values obtained in this study are smaller than the strength values for silicon published in the literature [36].

Figure 17:
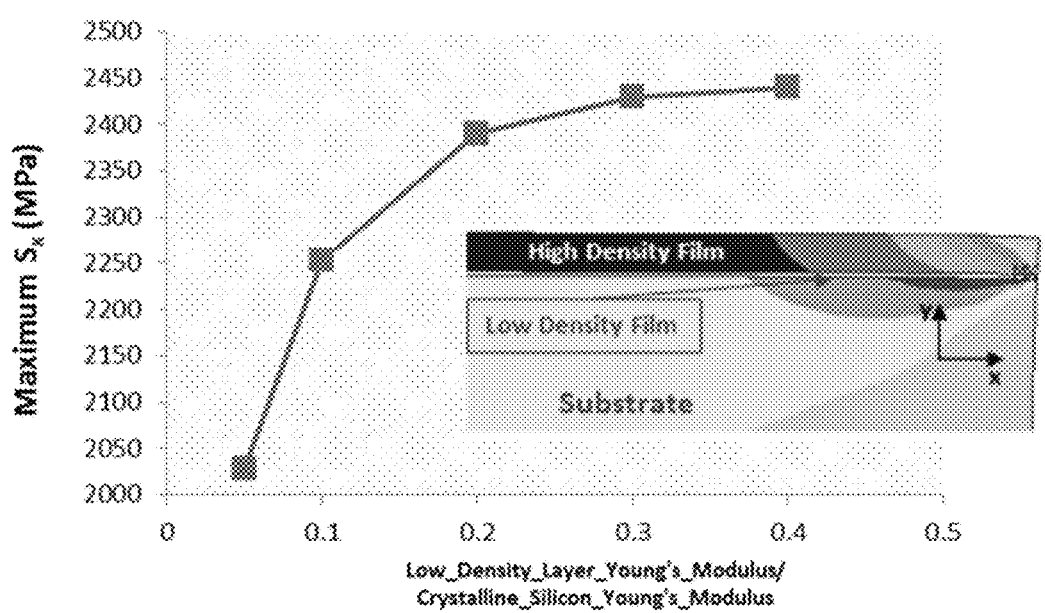
FIG. 17 shows a maximum residual stress computed in the substrate as increasing Young's Modulus in the density modulated film layer with a constant thickness in all of the thin film and substrate layers, according to embodiments of the invention.

It is noted that there is no available data in the literature on the material properties of the density modulated thin-film layer. Therefore, it was assumed that the Young's Modulus E in the density modulated thin film layer will be smaller than the one in the high-density thin film layer. It was assumed as 50% of the high density film E in Set-2 and Set-3 computations, while it was investigated in Set-4 analyses by keeping all of the layer thicknesses the same and only varying the E of the density modulated layer as shown in FIG. 17. Another parameter that needs further experimental investigation is the actual residual stress of strain forming during the physical vapor deposition of silicon thin films. In addition, since the thickness of the Si thin films are crucial for battery applications, experimental tests are being performed to determine critical thickness of the multilayer Si thin films, which can be manufactured without delamination.

3.3 Conclusion

The results obtained in this study shed light on the fundamental understanding of intrinsic stresses observed in similar thin film structures. Knowing the stress variations in thin layers will provide more robust designs by optimizing the geometry and material property of layers in the structure.

It was shown that a low density layer can introduce compliant behavior to a thin film that is under stress. We modelled the change in the residual stress in a conventional high density silicon thin film after the introduction of a low density compliant underlying Si film in between the substrate. It was shown that the resulting density modulated structure significantly reduced the maximum stress values concentrated at the film/substrate interface, which suggests the possibility of avoiding buckling or delamination of the coating. Therefore, density modulation can lead to the development of durable coatings with enhanced resistance to intrinsic or extrinsic stress, such as due to the residual stress originating from high energy species during film growth, thermal stress, or stress due to the insertion of ions/atoms as in the case of Si film anodes for Li-ion batteries. The simulation methodology employed in this study could also be utilized to analyze the maximum stresses during Li insertion/extraction in Si thin film anodes, which will be investigated in a future study.

Briefly, this invention provides, among other things, (a) density modulated thin films with stress reduction and enhanced mechanical stability, and a method to fabricate density modulated thin film electrodes that are capable of tolerating stress built-up during cycling and providing enhanced mechanical stability; (b) methods of controlling of the SEI layer formation in density modulated thin film electrodes, where mechanisms of the SEI layer formation in thin film electrodes is related to the film density, which is critical in determining the electrochemical performance of Li-ion batteries; and (c) several methods to improve the adhesion ability of a density modulated thin film to the current collector.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Cheng, F.; Liang, J.; Tao, Z.; Chen, J., Functional materials for rechargeable batteries. *Adv Mater* 2011, 23 (15), 1695-715.

[2]. Pillot, C. In *The worldwide battery market 2012-2025*, BATTERIES Oct. 14-16, 2013 Nice, FRANCE, 2013.

[3]. One Million Electric Vehicles By 2015 Report, D. O. E. Department of Energy Report: February, 2011.

[4]. Gaines, L.; Nelson, P., LITHIUM-ION BATTERIES: EXAMINING MATERIAL DEMAND AND RECYCLING ISSUES *Argonne National Laboratory, Argonne, IL* 2011.

[5]. Tarascon, J. M.; Armand, M., Issues and challenges facing rechargeable lithium batteries. *Nature* 2001, 414 (6861), 359-67.

[6]. Comission, *Recommendations on the Transport of Dangerous Goods*. United Nations: New York, 2002.

[7]. Barnett, B.; Ofer, D.; Yang, Y.; Oh, B.; Rempel, J.; McCoy, C.; Rhodes, T.; Hastbacka, M.; Sririramulu, S., PHEV BATTERY COST ASSESSMENT. In 2009 *DOE Merit Review*, TIAX LLC: 2010.

[8]. Dunn, J. B.; Gaines, L.; Sullivan, J.; Wang, M. Q., Impact of Recycling on Cradle-to-Gate Energy Consumption and Greenhouse Gas Emissions of Automotive Lithium-Ion Batteries. *Environmental Science & Technology* 2012, 46 (22), 12704-12710.

[9]. Goodenough, J. B.; Kim, Y., Challenges for Rechargeable Li Batteries. *Chem Mater* 2010, 22 (3), 587-603.

[10]. Aurbach, D.; Markovsky, B.; Salitra, G.; Markevich, E.; Talyossef, Y.; Koltypin, M.; Nazar, L.; Ellis, B.; Kovacheva, D., Review on electrode—electrolyte solution interactions, related to cathode materials for Li-ion batteries. *J Power Sources* 2007, 165 (2), 491-499.

[11]. Patil, A.; Patil, V.; Shin, D. W.; Choi, J. W.; Paik, D. S.; Yoon, S. J., Issue and challenges facing rechargeable thin film lithium batteries. *Mater Res Bull* 2008, 43 (8-9), 1913-1942.

[12]. Kasavajjula, U.; Wang, C. S.; Appleby, A. J., Nano- and bulk-silicon-based insertion anodes for lithium-ion secondary cells. *J Power Sources* 2007, 163 (2), 1003-1039.

[13]. B. A. Boukamp, G. C. L., R. A. Huggins, All-Solid Lithium Electrodes With Mixed-Conductor Matrix. *Journal of Electrochemical Society* 1981, 128 (4), 4. [14]. Cabana, J.; Monconduit, L.; Larcher, D.; Palacin, M. R., Beyond Intercalation-Based Li-Ion Batteries: The State of the Art and Challenges of Electrode Materials Reacting Through Conversion Reactions. *Advanced Materials* 2010, 22 (35), E170-E192.

[15]. Sharma, R. A.; Seefurth, R. N., Thermodynamic Properties of Lithium-Silicon System. *J Electrochem Soc* 1976, 123 (8), C239-C239.

[16]. (a) Xu, Y. H.; Yin, G. P.; Zuo, P. J., Geometric and electronic studies of Li15Si4 for silicon anode. *Electrochim Acta* 2008, 54 (2), 341-345; (b) Obrovac, M. N.; Christensen, L., Structural changes in silicon anodes during lithium insertion/extraction. *Electrochem Solid St* 2004, 7 (5), A93-A96.

[17]. Hatchard, T. D.; Dahn, J. R., In situ XRD and electrochemical study of the reaction of lithium with amorphous silicon. *J Electrochem Soc* 2004, 151 (6), A838-A842.

[18]. Green, M.; Fielder, E.; Scrosati, B.; Wachtler, M.; Moreno, J. S., Structured silicon anodes for lithium battery applications. *Electrochem Solid St* 2003, 6 (5), A75-A79.

[19]. (a) Holzapfel, M.; Buqa, H.; Hardwick, L. J.; Hahn, M.; Wursig, A.; Scheifele, W.; Novak, P.; Kotz, R.; Veit, C.; Petrat, F. M., Nano silicon for lithium-ion batteries. *Electrochim Acta* 2006, 52 (3), 973-978; (b) Lee, J. H.; Kim, W. J.; Kim, J. Y.; Lim, S. H.; Lee, S. M., Spherical silicon/graphite/carbon composites as anode material for lithium-ion batteries. *J Power Sources* 2008, 176 (1), 353-358; (c) Lee, H. Y.; Lee, S. M., Carbon-coated nano-Si dispersed oxides/graphite composites as anode material for lithium ion batteries. *Electrochem Commun* 2004, 6 (5), 465-469.

[20]. Shu, J.; Li, H.; Yang, R.; Shi, Y.; Huang, X., Cage-like carbon nanotubes/Si composite as anode material for lithium ion batteries. *Electrochem Commun* 2006, 8 (1), 51-54.

[21]. (a) Chan, C. K.; Peng, H. L.; Liu, G.; McIlwrath, K.; Zhang, X. F.; Huggins, R. A.; Cui, Y., High-performance lithium battery anodes using silicon nanowires. *Nat Nanotechnol* 2008, 3 (1), 31-35; (b) Teki, R.; Datta, M. K.; Krishnan, R.; Parker, T. C.; Lu, T. M.; Kumta, P. N.; Koratkar, N., Nanostructured silicon anodes for lithium ion rechargeable batteries. *Small* 2009, 5 (20), 2236-42.

[22]. Fan, Y.; Zhang, Q.; Lu, C. X.; Xiao, Q. Z.; Wang, X. H.; Tay, B. K., High performance carbon nanotube-Si core-shell wires with a rationally structured core for lithium ion battery anodes. *Nanoscale* 2013, 5 (4), 1503-1506.

[23]. Cui, L.-F.; Ruffo, R.; Chan, C. K.; Peng, H.; Cui, Y., Crystalline-Amorphous Core—Shell Silicon *Nanowires for High Capacity and High Current Battery Electrodes*. *Nano Letters* 2008, 9 (1), 491-495.

[24]. Lu, C. X.; Fan, Y.; Li, H.; Yang, Y.; Tay, B. K.; Teo, E.; Zhang, Q., Core-shell CNT-Ni—Si nanowires as a high performance anode material for lithium ion batteries. *Carbon* 2013, 63, 54-60.

[25]. Yi, R.; Dai, F.; Gordin, M. L.; Chen, S. R.; Wang, D. H., Micro-sized Si—C Composite with Interconnected Nanoscale Building Blocks as High-Performance Anodes for Practical Application in Lithium-Ion Batteries. *Adv Energy Mater* 2013, 3 (3), 295-300.

[26]. Yu, C.; Li, X.; Ma, T.; Rong, J.; Zhang, R.; Shaffer, J.; An, Y.; Liu, Q.; Wei, B.; Jiang, H., Silicon Thin Films as Anodes for High-Performance Lithium-Ion Batteries with Effective Stress Relaxation. *Adv Energy Mater* 2012.

[27]. Wu, H.; Chan, G.; Choi, J. W.; Ryu, I.; Yao, Y.; McDowell, M. T.; Lee, S. W.; Jackson, A.; Yang, Y.; Hu, L. B.; Cui, Y., Stable cycling of double-walled silicon nanotube battery anodes through solid-electrolyte interphase control. *Nat Nanotechnol* 2012, 7 (5), 309-314.

[28]. Kim, H.; Cho, J., Superior Lithium Electroactive Mesoporous Si@Carbon Core—Shell Nanowires for Lithium Battery Anode Material. *Nano Letters* 2008, 8 (11), 3688-3691.

[29]. (a) Arie, A. A.; Song, J. O.; Lee, J. K., Structural and electrochemical properties of fullerene-coated silicon thin film as anode materials for lithium secondary batteries. *Mater Chem Phys* 2009, 113 (1), 249-254; (b) Doh, C. H.; Park, C. W.; Shin, H. M.; Kim, D. H.; Chung, Y. D.; Moon, S. I.; Jin, B. S.; Kim, H. S.; Veluchamy, A., A new SiO/C anode composition for lithium-ion battery. *J Power Sources* 2008, 179 (1), 367-370; (c) Ren, Y. R.; Qu, M. Z.; Yu, Z. L., SiO/CNTs: A new anode composition for lithium-ion battery. *Sci China Ser B* 2009, 52 (12), 2047-2050; (d) Takamura, T.; Awano, H.; Ura, T.; Sumiya, K., A key technology to improve the cyclic performances of carbonaceous materials for lithium secondary battery anodes. *J Power Sources* 1997, 68 (1), 114-119.

[30]. Patzig, C.; Karabacak, T.; Fuhrmann, B.; Rauschenbach, B., Glancing angle sputter deposited nanostructures on rotating substrates: Experiments and simulations. *J Appl Phys* 2008, 104 (9).

[31]. (a) Ohara, S.; Suzuki, J.; Sekine, K.; Takamura, T., A thin film silicon anode for Li-ion batteries having a very large specific capacity and long cycle life. *J Power Sources* 2004, 136 (2), 303-306; (b) Ohara, S.; Suzuki, J.; Sekine, K.; Takamura, T., Li insertion/extraction reaction at a Si film evaporated on a Ni foil. *J Power Sources* 2003, 119, 591-596; (c) Uehara, M.; Suzuki, J.; Tamura, K.; Sekine, K.; Takamura, T., Thick vacuum deposited silicon films suitable for the anode of Li-ion battery. *J Power Sources* 2005, 146 (1-2), 441-444; (d) Takamura, T.; Uehara, M.; Suzuki, J.; Sekine, K.; Tamura, K., High capacity and long cycle life silicon anode for Li-ion battery. *J Power Sources* 2006, 158 (2), 1401-1404; (e) Yin, J.; Wada, M.; Yamamoto, K.; Kitano, Y.; Tanase, S.; Sakai, T., Micrometer-Scale Amorphous Si Thin-Film Electrodes Fabricated by Electron-Beam Deposition for Li-Ion Batteries. *J Electrochem Soc* 2006, 153 (3), A472-A477.

[32]. (a) Wang, Y. H.; He, Y.; Xiao, R. J.; Li, H.; Aifantis, K. E.; Huang, X. J., Investigation of crack patterns and cyclic performance of Ti—Si nanocomposite thin film anodes for lithium ion batteries. *J Power Sources* 2012, 202 (0), 236-245; (b) Li, H.; Cheng, F.; Zhu, Z.; Bai, H.; Tao, Z.; Chen, J., Preparation and electrochemical performance of copper foam-supported amorphous silicon thin films for rechargeable lithium-ion batteries. *J Alloy Compd* 2011, 509 (6), 2919-2923.

[33]. Takamura, T.; Ohara, S.; Uehara, M.; Suzuki, J.; Sekine, K., A vacuum deposited Si film having a Li extraction capacity over 2000 mAh/g with a long cycle life. *J Power Sources* 2004, 129 (1), 96-100.

[34]. Graetz, J.; Ahn, C. C.; Yazami, R.; Fultz, B., Highly Reversible Lithium Storage in Nanostructured Silicon. *Electrochemical and Solid-State Letters* 2003, 6 (9), A194-A197.

[35]. Bourderau, S.; Brousse, T.; Schleich, D. M., Amorphous silicon as a possible anode material for Li-ion batteries. *J Power Sources* 1999, 81, 233-236.

[36]. Maranchi, J. P.; Hepp, A. F.; Evans, A. G.; Nuhfer, N. T.; Kumta, P. N., Interfacial Properties of the a-Si/Cu: Active—Inactive Thin-Film Anode System for Lithium-Ion Batteries. *J Electrochem Soc* 2006, 153 (6), A1246-A1253.

[37]. Lee, K.-L.; Jung, J.-Y.; Lee, S.-W.; Moon, H.-S.; Park, J.-W., Electrochemical characteristics of a-Si thin film anode for Li-ion rechargeable batteries. *J Power Sources* 2004, 129 (2), 270-274.

[38]. (a) Karabacak, T.; Picu, C. R.; Senkevich, J. J.; Wang, G. C.; Lu, T. M., Stress reduction in tungsten films using nanostructured compliant layers. *J Appl Phys* 2004, 96 (10), 5740-5746; (b) Karabacak, T.; Senkevich, J. J.; Wang, G. C.; Lu, T. M., Stress reduction in sputter deposited films using nanostructured compliant layers by high working-gas pressures. *J Vac Sci Technol A* 2005, 23 (4), 986-990; (c) Alagoz, A.; Kamminga, J.; Grachev, S.

[38]. Y.; Lu, T.-M.; Karabacak, T., Residual Stress Reduction in Sputter Deposited Thin Films by Density Modulation. *MRS Proceedings* 2009, 1224-FF05-22 6.

[39]. Sethuraman, V. A.; Chon, M. J.; Shimshak, M.; Srinivasan, V.; Guduru, P. R., <i>In situ</i> measurements of stress evolution in silicon thin films during electrochemical lithiation and delithiation. *J Power Sources* 2010, 195 (15), 5062-5066.

[40]. Li, J. C.; Dozier, A. K.; Li, Y. C.; Yang, F. Q.; Cheng, Y. T., Crack Pattern Formation in Thin Film Lithium-Ion Battery Electrodes. *J Electrochem Soc* 2011, 158 (6), A689-A694.

[41]. Griffith, A. A., The phenomena of rupture and flow in solids. *Philosophical Transactions of the Royal Society of London* 1921, 221 (Series A), 163-198.

[42]. Besenhard, J. O.; Winter, M.; Yang, J.; Biberacher, W., Filming Mechanism of Lithium-Carbon Anodes in Organic and Inorganic Electrolytes. *J Power Sources* 1995, 54 (2), 228-231.

[43]. Xiao, X.; Liu, P.; Verbrugge, M. W.; Haftbaradaran, H.; Gao, H., Improved cycling stability of silicon thin film electrodes through patterning for high energy density lithium batteries. *J Power Sources* 2011, 196 (3), 1409-1416.

[44]. (a) Li, W. M., Atomic layer deposition methods for forming a multi-layer adhesion-barrier layer for integrated circuits. Google Patents: 2005; (b) Wang, R.; Chung, H.; Tang, X.; Wang, J. Y.; Wang, W. D.; Tanaka, Y.; Jick, M. Y.; Gopalraja, P., Integrated process for sputter deposition of a conductive barrier layer, especially an alloy of ruthenium and tantalum, underlying copper or copper alloy seed layer. Google Patents: 2006.

[45]. Krishnan, R.; Lu, T. M.; Koratkar, N., Functionally Strain-Graded Nanoscoops for High Power Li-Ion Battery Anodes. *Nano Letters* 2011, 11 (2), 377-384.

[46]. Karabacak, T.; Singh, J. P.; Zhao, Y. P.; Wang, G. C.; Lu, T. M., Scaling during shadowing growth of isolated nanocolumns. *Phys Rev B* 2003, 68 (12).

[47]. Sloop, S. E.; Kerr, J. B.; Kinoshita, K., The role of Li-ion battery electrolyte reactivity in performance decline and self-discharge. *J Power Sources* 2003, 119-121 (0), 330-337.

[48]. (a) Thornton, J. A., High rate thick film growth. *Annual review of materials science* 1977, 7 (1), 239-260, (b) J. A. Thornton, J Vac Sci Technol 11, 666-670 (1974), (c) J. A. Thornton, J Vac Sci Technol 12, 830-835 (1975), and (d) J. A. Thornton, Journal of Vacuum Science & Technology a-Vacuum Surfaces and Films 4, 3059-3065 (1986).

[49]. Petrov, I.; Barna, P.; Hultman, L.; Greene, J., Microstructural evolution during film growth. *Journal of Vacuum Science & Technology A: Vacuum, Surfaces, and Films* 2003, 21, S117.

[50]. Smith, D. L., *Thin-film deposition: principles and practice*. McGraw-Hill Professional: 1995.

[51]. Roth, J. R., *Industrial Plasma Engineering: Applications to nonthermal plasma processing*. Institute of Physics: 2001.

[52]. Karabacak, T.; Zhao, Y. P.; Wang, G. C.; Lu, T. M., Growth-front roughening in amorphous silicon films by sputtering. *Phys Rev B* 2001, 64 (8).

[53]. Young, N. O.; Kowal, J., Optically Active Fluorite Films. *Nature* 1959, 183 (4654), 104-105.

[54]. Karabacak, T.; Wang, G. C.; Lu, T. M., Physical self-assembly and the nucleation of three-dimensional nanostructures by oblique angle deposition. *Journal of Vacuum Science & Technology A: Vacuum, Surfaces, and Films* 2004, 22 (4), 1778-1784.

[55]. Demirkan, M. T.; Xin Li; Wei, B.; Karabacak, T., Density modulated multilayer silicon thin films as li-ion battery anodes. *MRS Proceedings* (2012), 1440.

[56]. Demirkan, M. T.; Trahey, L.; Karabacak, T., Cycling performance of density modulated multilayer silicon thin film anodes in Li-ion batteries. *J of Power Sources* (2015), 273 (52).

[57]. Jing, S., Jiang, H., Hu, Y., Li, C., *Nanoscale* 6, 2014, 14441-14445.

[58]. S. C. Jung, J. W. Choi and Y. K. Han, Nano Lett 12, 5342-5347 (2012).

[59]. H. Windischmann, Journal of Vacuum Science & Technology a-Vacuum Surfaces and Films 9, 2431-2436 (1991).

[60]. A. M. Haghirigosnet, F. R. Ladan, C. Mayeux, H. Launois and M. C. Joncour, Journal of Vacuum Science & Technology a-Vacuum Surfaces and Films 7, 2663-2669 (1989).

[61]. R. Messier, A. P. Giri and R. A. Roy, Journal of Vacuum Science & Technology a-Vacuum Surfaces and Films 2, 500-503 (1984).

[62]. J. Shaffer, *Finite Element Analysis of Silicon Thin Films on Soft Substrates as Anodes for Lithium Ion Batteries*. (2011).

[63]. S. Pal, S. S. Damle, P. N. Kumta and S. Maiti, Comp Mater Sci 79, 877-887 (2013).

[64]. M. W. Lin, A. O. Abatan and C. A. Rogers, J Intel Mat Syst Str 5, 869-875 (1994).

[65]. D. Roylance, Finite Element Analysis, http://ocw.mit.edu/courses/materials-science-and-engineering/3-11-mechanics-of-materials-fall-1999/modules/fea.pdf, 2001.

[66]. L. B. Freund and S. Suresh, *Thin Film Materials: Stress, Defect Formation and Surface Evolution*. (Cambridge University Press, 2003).

[67]. C. Lu, x, Shun, O. Lewis, J Appl Phys, 43 (1972) 4385-4390.

[68]. M. F. Cansizoglu, T. Karabacak, Mat. Res. Soc. Symp. Proc., Paper #: 1216-W05-03 (2010).

[69]. L. B. Chen, J. Y. Xie, H. C. Yu, T. H. Wang, J Appl Electrochem, 39 (2009) 1157-1162.

What is claimed is:

1. An electrode usable for a battery, comprising:
a substrate formed of a current collecting material;
at least one layer formed of a silicon film on the substrate, the at least one layer having a first surface and an opposite, second surface, and a density that is changed with a distance defined from the first surface to a plane in the at least one layer, wherein the density of the at least one layer of the silicon film is changed in the form of one or multiple periods of a sine wave function of the distance, or in the form of a rectangular function of the distance, the plane being parallel to the first surface, wherein a maximal value of the distance is a thickness of the at least one layer defined between the first and second surfaces; and
a capping layer having a density higher than the lowest density, formed on the second surface of the at least one layer of the silicon film, when the density of the at least one layer of the electrode material at the second surface has the lowest density, wherein the capping layer is formed of only a material that is same as the silicon film of the at least one layer.

2. The electrode of claim 1, wherein the substrate comprises nanorod arrays formed of the current collecting material, such that the first surface of the at least one layer of the silicon film is adhered to the substrate through the nanorod arrays.

3. The electrode of claim 1, wherein the current collecting material comprises copper (Cu), nickel (Ni), or aluminum (Al).

4. The electrode of claim 1, further comprising an adhesion and compliant layer formed between the substrate and the at least one layer of the silicon film.

5. The electrode of claim 4, wherein the adhesion and compliant layer comprises nanorod arrays.

6. The electrode of claim 4, wherein the adhesion and compliant layer is formed of chromium (Cr), titanium (Ti), nickel (Ni), tantalum (Ta), molybdenum (Mo), or tungsten (W).

7. The electrode of claim 4, wherein the adhesion and compliant layer is a graded composite layer of the current collecting material and a material that is same as the at least one layer of the silicon film, formed by co-depositing the current collecting material and the material that is same as the at least one layer of the silicon film with varying compositions as a function of thickness of the graded composite layer, wherein the graded composite layer has a first surface being adhered to the substrate and an opposite, second surface being adhered to the first surface of the at least one layer of the silicon film, and wherein ratio of the current collecting material to the material that is same as the at least one layer of the silicon film of the graded composite layer is changed from 100:0 at the first surface of the graded composite layer to 0:100 at the second surface of the graded composite layer by controlling their relative deposition rates.

\* \* \* \* \*